(12) United States Patent
Kim

(10) Patent No.: US 11,443,782 B2
(45) Date of Patent: Sep. 13, 2022

(54) ELECTRONIC DEVICE TO PERFORM READ OPERATION AND MODE REGISTER READ OPERATION

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/306,598

(22) Filed: May 3, 2021

(65) Prior Publication Data

US 2021/0375336 A1 Dec. 2, 2021

Related U.S. Application Data

(63) Continuation-in-part of application No. 17/009,413, filed on Sep. 1, 2020, now Pat. No. 11,133,055.

(30) Foreign Application Priority Data

Jun. 1, 2020 (KR) ........................ 10-2020-0066110

(51) Int. Cl.
*G11C 7/22* (2006.01)
*G11C 7/10* (2006.01)

(52) U.S. Cl.
CPC ............ *G11C 7/1051* (2013.01); *G11C 7/222* (2013.01)

(58) Field of Classification Search
CPC .................................................. G11C 7/105
See application file for complete search history.

(56) References Cited

U.S. PATENT DOCUMENTS

| 6,298,004 | B1 | 10/2001 | Kawasaki et al. |
| 6,711,090 | B2 | 3/2004 | Fujimori |
| 11,133,055 | B1* | 9/2021 | Kim ................... G11C 11/4096 |
| 2008/0159041 | A1* | 7/2008 | Okuda .................. G11C 29/14 |
| | | | 365/201 |
| 2012/0120753 | A1* | 5/2012 | Fujisawa ............. G11C 11/4076 |
| | | | 365/230.06 |
| 2013/0080826 | A1 | 3/2013 | Kondo |
| 2020/0066325 | A1 | 2/2020 | Kang et al. |
| 2020/0160895 | A1* | 5/2020 | Kim ..................... G11C 7/1066 |
| 2020/0211630 | A1* | 7/2020 | Kim ................... G11C 11/4087 |

FOREIGN PATENT DOCUMENTS

KR 100703976 B1 4/2007

\* cited by examiner

*Primary Examiner* — Min Huang
(74) *Attorney, Agent, or Firm* — William Park & Associates Ltd.

(57) ABSTRACT

An electronic device may include: a column control circuit configured to generate a column control pulse and a mode register enable signal, each with a pulse that is generated based on logic levels of a chip selection signal and a command address; and a control circuit configured to generate a read control signal to perform a read operation and a mode register read operation by delaying the column control pulse based on a logic level of the mode register enable signal and configured to generate a mode register control signal to perform the mode register read operation by delaying the column control pulse based on a logic level of the mode register enable signal.

20 Claims, 29 Drawing Sheets

US 11,443,782 B2

ELECTRONIC DEVICE TO PERFORM READ OPERATION AND MODE REGISTER READ OPERATION

CROSS-REFERENCES TO RELATED APPLICATION

This application is a continuation-in-part of U.S. patent application Ser. No. 17/009,413, filed on Sep. 1, 2020, which claims the priority of Korean Patent Application No. 10-2020-0066110, filed on Jun. 1, 2020 in the Korean Intellectual Property Office.

BACKGROUND

1. Technical Field

Various embodiments generally relate to an electronic device to perform a read operation and a mode register read operation.

2. Related Art

In general, a semiconductor device with a DDR SDRAM (Double Data Rate Synchronous DRAM) performs a data read/write operation based on a command that is input from an external chip set. The semiconductor device needs to perform an active operation in order to perform the write operation and the read operation. The semiconductor device generates signals to perform an active operation based on a command and address input through a command address pin. At this time, the semiconductor device generates signals to perform a read operation and a write operation, through commands that are sequentially input, using a chip selection signal.

The semiconductor device includes a register that stores operation information and internal information by performing a mode register read operation. Furthermore, the semiconductor device performs the mode register read operation to output a signal with that includes the operation information and internal information that are stored in the register during the mode register read operation.

SUMMARY

In an embodiment, an electronic device may include: a column control circuit configured to generate a column control pulse, an internal column control pulse, and a mode register enable signal, each of which includes a pulse that is generated according to the logic levels of a chip selection signal and a command address; and a control circuit configured to generate a data output control signal based on the column control pulse and the internal column control pulse according to the logic level of the mode register enable signal and configured to generate a read control signal for a read operation and a mode register control signal for a mode register read operation by delaying a read sum signal that is generated based on any one of the column control pulse and the internal column control pulse.

In an embodiment, an electronic device may include: a control circuit configured to generate a data output control signal for a read operation based on a column control pulse and an internal column control pulse according to the logic level of a mode register enable signal, configured to generate a read control signal for the read operation and a mode register control signal for a mode register read operation based on any one of the column control pulse and the internal column control pulse, and configured to generate a first input control signal, a second input control signal, a first output control signal and a second output control signal based on any one of the column control pulse and the internal column control pulse; and an input/output circuit configured to output, as data, any one of internal data that is generated through a core circuit and an operation code generated through an operation code generation circuit, according to the logic levels of the read control signal and the mode register control signal.

DETAILED DESCRIPTION

The term "preset" indicates that the value of a parameter is previously decided, when the parameter is used in a process or algorithm. Based on an embodiment, the value of the parameter may be set when the process or algorithm is started or while the process or algorithm is performed.

The terms such as "first" and "second", which are used to distinguish among various components, are not limited by the components. For example, a first component may be referred to as a second component, and vice versa.

When one component is referred to as being "coupled" or "connected" to another component, it may indicate that the components are directly coupled or connected to each other or coupled or connected to each other through another component interposed therebetween. On the other hand, when one component is referred to as being "directly coupled" or "directly connected" to another component, it may indicate that the components are directly coupled or connected to each other without another component interposed therebetween.

"Logic high level" and "logic low level" are used to describe the logic levels of signals. A signal having "logic high level" is distinguished from a signal having "logic low level". For example, when a signal having a first voltage corresponds to "logic high level", a signal having a second voltage may correspond to "logic low level". Based on an embodiment, "logic high level" may be set to a voltage higher than "logic low level". Based on an embodiment, the logic levels of signals may be set to different logic levels or opposite logic levels. For example, a signal having a logic high level may be set to have a logic low level based on an embodiment, and a signal having a logic low level may be set to have a logic high level based on an embodiment.

Hereafter, exemplary embodiments will be described in more detail. The embodiments are only used to exemplify the present disclosure, and the scope of the present disclosure is not limited by the embodiments.

Various embodiments are directed to an electronic device that generates a signal to perform a read operation and a mode register read operation by delaying the signal through one delay circuit.

In accordance with the present embodiments, the electronic device can generate the signal to perform the read operation and the mode register read operation by delaying the signal through one delay circuit, thereby reducing the area.

Figure 1:
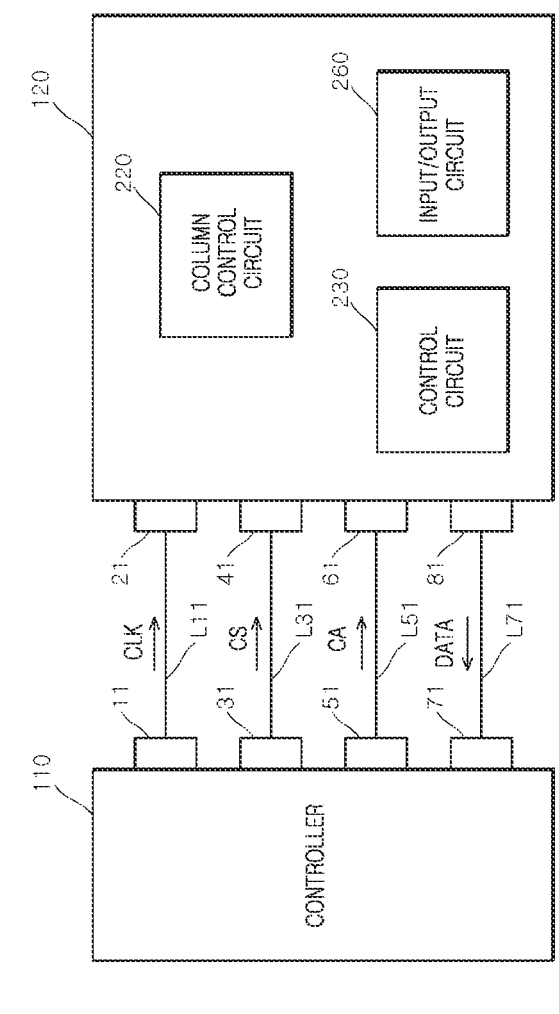
FIG. 1 is a block diagram, illustrating a configuration of an electronic device in accordance with an embodiment.

As illustrated in FIG. 1, an electronic device 100 may include a controller 110 and a semiconductor device 120. The semiconductor device 120 may include a column control circuit 220, a control circuit 230, and an input/output circuit 260.

The controller 110 may include a first control pin 11, a second control pin 31, a third control pin 51, and a fourth control pin 71. The semiconductor device 120 may include a first semiconductor pin 21, a second semiconductor pin 41, a third semiconductor pin 61, and a fourth semiconductor pin 81. A first transmission line 11 may be coupled between the first control pin 11 and the first semiconductor pin 21. A second transmission line L31 may be coupled between the second control pin 31 and the second semiconductor pin 41. A third transmission line L51 may be coupled between the third control pin 51 and the third semiconductor pin 61. A fourth transmission line L71 may be coupled between the fourth control pin 71 and the fourth semiconductor pin 81. The controller 110 may transmit a clock CLK to the semiconductor device 120 through the first transmission line 11 in order to control the semiconductor device 120. The controller 110 may transmit a chip selection signal CS to the semiconductor device 120 through the second transmission line L31 in order to control the semiconductor device 120. The controller 110 may transmit a command address CA to the semiconductor device 120 through the third transmission line L51 in order to control the semiconductor device 120. The controller 110 and the semiconductor device 120 may receive data DATA through the fourth transmission line L71.

The controller 110 may output the clock CLK, the chip selection signal CS, and the command address CA to the semiconductor device 120 to perform a read operation and a mode register read operation. The controller 110 may receive the data DATA from the semiconductor device 120 during the read operation and the mode register read operation. The chip selection signal CS and the command address CA may be sequentially outputted in synchronization with odd pulses or even pulses included in the clock CLK.

The column control circuit 220 may generate a column control pulse (RD_AYP of FIG. 2) and a mode register enable signal (MRREN of FIG. 2) based on a logic level combination of the chip selection signal CS and the command address CA. The column control circuit 220 may generate the column control pulse (RD_AYP of FIG. 2) when the logic level combination of the chip selection signal CS and the command address CA is a combination to perform the read operation and the mode register read operation. The column control circuit 220 may generate the mode register enable signal (MRREN of FIG. 2) when the logic level combination of the chip selection signal CS and the command address CA is a combination to perform the mode register read operation.

Figure 2:
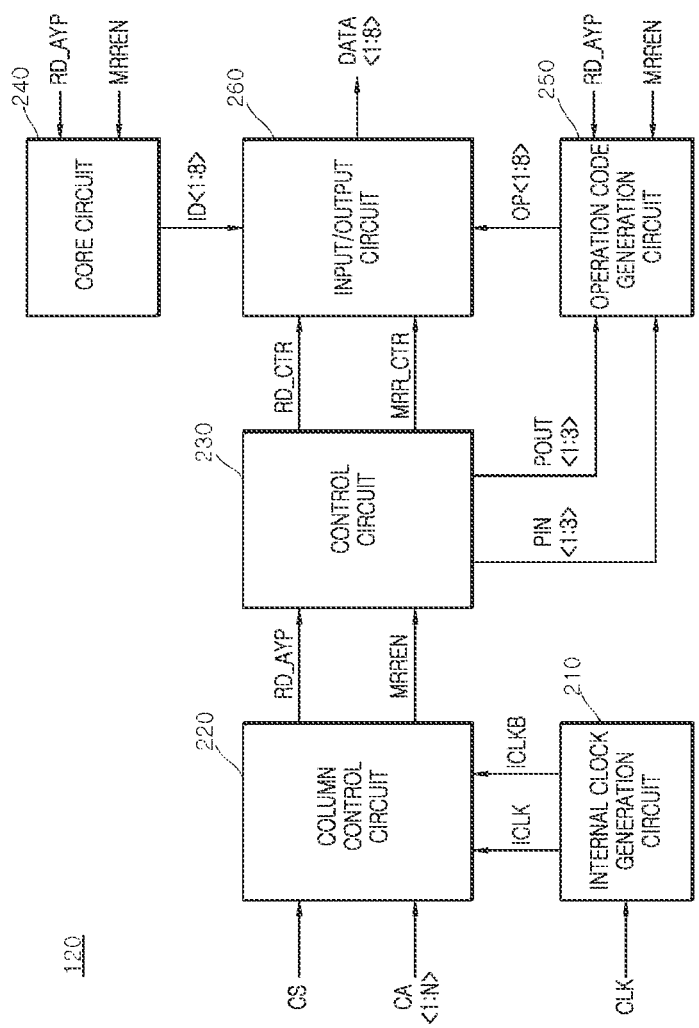
FIG. 2 is a block diagram, illustrating a configuration of a semiconductor device included in the electronic device, illustrated in FIG. 1.

The control circuit 230 may generate a read control signal (RD_CTR of FIG. 2) to perform the read operation and the mode register read operation by delaying the column control pulse (RD_AYP of FIG. 2) based on the logic level of the mode register enable signal (MRREN of FIG. 2). The control circuit 230 may generate a mode register control signal (MRR_CTR of FIG. 2) to perform the mode register read operation by delaying the column control pulse (RD_AYP of FIG. 2) based on the logic level of the mode register enable signal (MRREN of FIG. 2).

The input/output circuit 260 may output internal data (ID<1:8> of FIG. 2) as the data DATA during the read operation. The input/output circuit 260 may output an operation code (OP<1:8> of FIG. 2) as the data DATA during the more register read operation.

FIG. 2 is a block diagram, illustrating a configuration of the semiconductor device 120 in accordance with an embodiment. As illustrated in FIG. 2, the semiconductor device 120 may include an internal clock generation circuit 210, a column control circuit 220, a control circuit 230, a core circuit 240, an operation code generation circuit 250, and an input/output circuit 260.

The internal clock generation circuit 210 may receive the clock CLK and generate a first internal clock ICLK and a second internal clock ICLKB. The internal clock generation circuit 210 may generate the first internal clock ICLK and the second internal clock ICLKB by controlling the phase of the clock CLK. The internal clock generation circuit 210 may generate the first internal clock ICLK and the second internal clock ICLKB by dividing the frequency of the clock CLK. The internal clock generation circuit 210 may generate the first internal clock ICLK and the second internal clock ICLKB, which have a frequency that corresponds to ½ of the frequency of the clock CLK. The clock CLK may be set to a signal that periodically toggles to control the operation of the electronic device 100. The operation of the internal clock generation circuit 210 to generate the first internal clock ICLK and the second internal clock ICLKB by dividing the frequency of the clock CLK will be described in detail with reference to FIG. 3, which will be described below.

The column control circuit 220 may generate the column control pulse RD_AYP and the mode register enable signal MRREN based on a logic level combination of the chip selection signal CS and the command address CA<1:N> in synchronization with the first internal clock ICLK and the second internal clock ICLKB. The column control circuit 220 may generate the column control pulse RD_AYP with a pulse that is generated when the logic level combination of the chip selection signal CS and the command address CA<1:N> is a combination to perform the read operation in synchronization with the first internal clock ICLK and the second internal clock ICLKB. The column control circuit 220 may generate the column control pulse RD_AYP with a pulse that is generated when the logic level combination of the chip selection signal CS and the command address CA<1:N> is a combination to perform the mode register read operation in synchronization with the first internal clock ICLK and the second internal clock ICLKB. The column control circuit 220 may generate the mode register enable signal MRREN that is enabled when the logic level combination of the chip selection signal CS and the command address CA<1:N> is a combination to perform the mode register read operation in synchronization with the first internal clock ICLK and the second internal clock ICLKB. The pulse included in the column control pulse RD_AYP may be set to a logic high-level pulse. The logic level at that the mode register enable signal MRREN is enabled may be set to a logic high level.

The control circuit 230 may generate the read control signal RD_CTR to perform the read operation and the mode register read operation by delaying the column control pulse RD_AYP based on the logic level of the mode register enable signal MRREN. The control circuit 230 may generate a mode register control signal MRR_CTR to perform the mode register read operation by delaying the column control pulse RD_AYP based on the logic level of the mode register enable signal MRREN. The control circuit 230 may generate first to third input control signals PIN<1:3>, which are sequentially enabled, based on the column control pulse RD_AYP. The control circuit 230 may generate first to third output control signals POUT<1:3>, which are sequentially enabled, based on the mode register enable signal MRREN and the column control pulse RD_AYP.

The core circuit 240 may output internal data ID<1:8>, stored therein, during the read operation based on the column control pulse RD_AYP and the mode register enable signal MRREN. The core circuit 240 may output the internal data ID<1:8>, stored therein, when the column control pulse RD_AYP is inputted and the mode register enable signal MRREN is disabled.

The operation code generation circuit 250 may latch storage data (SE<1:8> of FIG. 8), stored therein, based on the first to third input control signals PIN<1:3>, during the mode register read operation based on the column control pulse RD_AYP and the mode register enable signal MRREN. The operation code generation circuit 250 may output the storage data (SE<1:8> of FIG. 8), stored therein, as the operation code OP<1:8> based on the first to third output control signals POUT<1:3>, during the mode register read operation based on the column control pulse RD_AYP and the mode register enable signal MRREN.

The input/output circuit 260 may output the internal data ID<1:8> as data DATA<1:8> based on the read control signal RD_CTR and the mode register control signal MRR_CTR during the read operation. The input/output circuit 260 may output the operation code OP<1:8> as the data DATA<1:8> based on the read control signal RD_CTR and the mode register control signal MRR_CTR during the mode register read operation.

Figure 3:
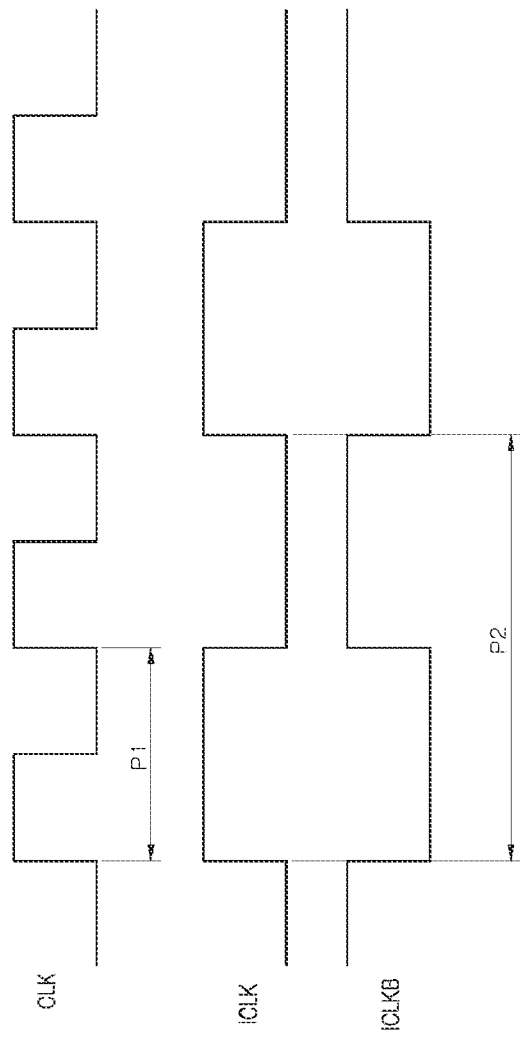
FIG. 3 is a diagram for describing an operation of an internal clock generation circuit that is included in the semiconductor device as illustrated in FIG. 2.

Referring to FIG. 3, the operation of the internal clock generation circuit 210 will be described as follows.

The internal clock generation circuit 210 may generate the first internal clock ICLK and the second internal clock ICLKB by dividing the frequency of the clock CLK. One period P2 of each of the first and second internal clocks ICLK and ICLKB may be set to a period that is twice longer than one period P1 of the clock CLK. The frequency of each of the first and second internal clocks ICLK and ICLKB may be set to ½ of the frequency of the clock CLK. The first and second internal clocks ICLK and ICLKB may toggle in synchronization with rising edges of the clock CLK. The first and second internal clocks ICLK and ICLKB may be exactly out of phase from each other.

Figure 4:
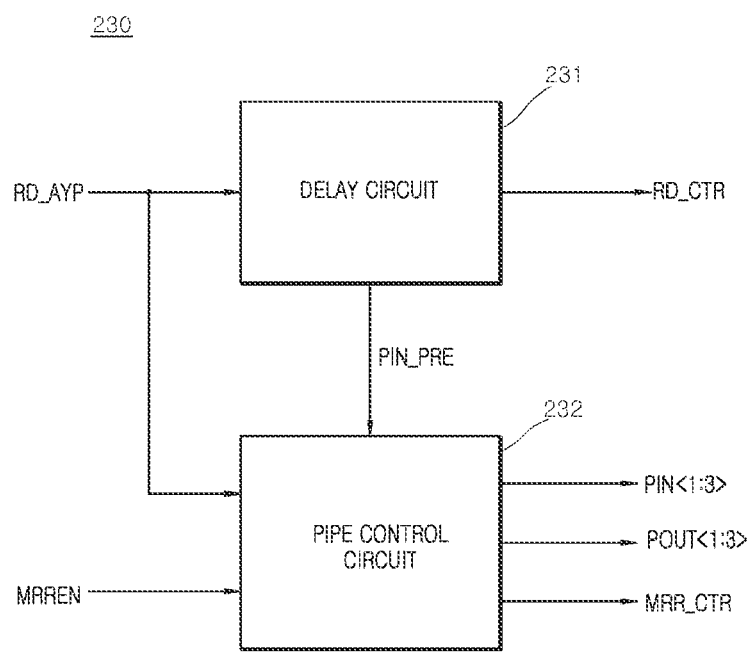
FIG. 4 is a block diagram, illustrating a configuration of a control circuit that is included in the semiconductor device as illustrated in FIG. 2.

Referring to FIG. 4, the control circuit 230 may include a delay circuit 231 and a pipe control circuit 232.

The delay circuit 231 may generate a pre-input control signal PIN_PRE and the read control signal RD_CTR, with pulses, which are sequentially generated, by delaying the column control pulse RD_AYP. The delay circuit 231 may generate the pre-input control signal PIN_PRE by delaying the column control pulse RD_AYP. The delay circuit 231 may generate the read control signal RD_CTR by delaying the pre-input control signal PIN_PRE. The delay amount of the delay circuit 231 may be set to the same delay amount as the time required for the core circuit 240 to output the internal data ID<1:8>. The delay amount of the delay circuit 231 may be set to the same delay amount as the time required for the operation code generation circuit 250 to output the operation code OP<1:8>.

The pipe control circuit 232 may generate the first to third input control signals PIN<1:3>, which are sequentially enabled, during the mode register read operation. The pipe control circuit 232 may generate the first to third input control signals PIN<1:3>, which are sequentially enabled, based on the column control pulse RD_AYP. The pipe control circuit 232 may generate the mode register control signal MRR_CTR from the mode register enable signal MRREN based on the first to third input control signals PIN<1:3>. The pipe control circuit 232 may latch the mode register enable signal MRREN based on the first to third input control signals PIN<1:3>. The pipe control circuit 232 may generate the mode register control signal MRR_CTR from the latched mode register enable signal MRREN. The pipe control circuit 232 may generate the first to third output control signals POUT<1:3>, which are sequentially enabled, during the mode register read operation. The pipe control circuit 232 may generate the first to third output control signals POUT<1:3>, which are sequentially enabled, from the mode register control signal MRR_CTR and the pre-input control signal PIN_PRE.

Figure 5:
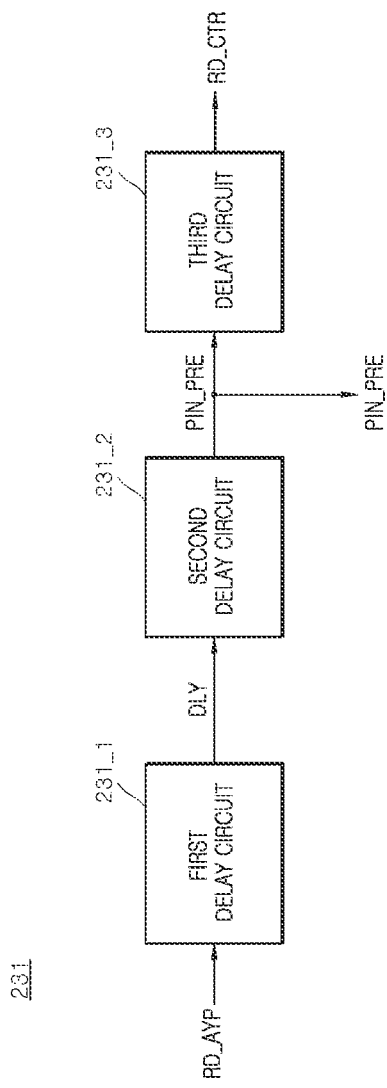
FIG. 5 is a block diagram, illustrating a configuration of a delay circuit that is included in the control circuit as illustrated in FIG. 4.

Referring to FIG. 5, the delay circuit 231 may include a first delay circuit 231_1, a second delay circuit 231_2 and a third delay circuit 231_3.

The first delay circuit 231_1 may generate a delay signal DLY by delaying the column control pulse RD_AYP.

The second delay circuit 231_2 may generate the pre-input control signal PIN_PRE by delaying the delay signal DLY.

The third delay circuit 231_3 may generate the read control signal RD_CTR by delaying the pre-input control signal PIN_PRE.

The first to third delay circuits 231_1 to 231_3 may be set to have the same delay amount. The sum of the delay amounts of the first to third delay circuits 231_1 to 231_3 may be set to the same delay amount as the time required for the core circuit 240 to output the internal data ID<1:8>. The sum of the delay amounts of the first to third delay circuits 231_1 to 231_3 may be set to the same delay amount as the time required for the operation code generation circuit 250 to output the operation code OP<1:8>.

Figure 6:
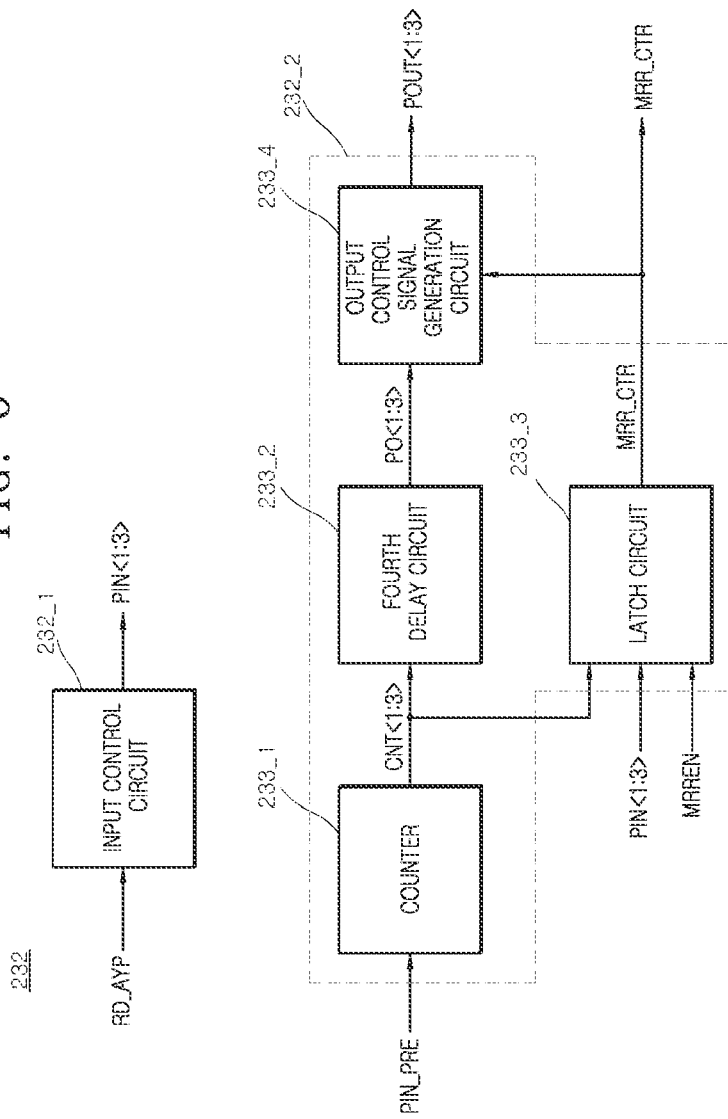
FIG. 6 is a block diagram, illustrating a configuration of a pipe control circuit that is included in the control circuit, illustrated in FIG. 4.

Referring to FIG. 6, the pipe control circuit 232 may include an input control circuit 232_1 and an output control circuit 232_2. The output control circuit 232_2 may include a counter 233_1, a fourth delay circuit 233_2, a latch circuit 233_3 and an output control signal generation circuit 233_4.

The input control circuit 232_1 may generate the first to third input control signals PIN<1:3>, which are sequentially counted, based on pulses of the column control pulse RD_AYP. The input control circuit 232_1 may generate the first to third input control signals PIN<1:3>, which are sequentially counted, when the pulses of the column control pulse RD_AYP are inputted at a logic high level. For example, the input control circuit 232_1 may enable the first input control signal PIN<1> when the pulse of the column control pulse RD_AYP is inputted once. The input control circuit 232_1 may be implemented to enable the first input control signal PIN<1> when the pulse of the column control pulse RD_AYP is inputted after the third input control signal PIN<3> is enabled.

The counter 233_1 may generate first to third counting signals CNT<1:3>, which are sequentially counted, based on pulses of the pre-input control signal PIN_PRE.

The counter 233_1 may generate the first to third counting signals CNT<1:3>, which are sequentially counted, when the pulses of the pre-input control signal PIN_PRE are inputted at a logic high level. For example, the counter 233_1 may enable the first counting signal CNT<1> when the pulse of the pre-input control signal PIN_PRE is inputted once. The counter 233_1 may be implemented to enable the first counting signal CNT<1> when the pulse of the pre-input control signal PIN_PRE is inputted after the third counting signal CNT<3> is enabled.

The fourth delay circuit 233_2 may generate first to third pre-output control signals PO<1:3> by delaying the first to third counting signals CNT<1:3>. Based on an embodiment, the delay amount of the fourth delay circuit 233_2 may be set to various values.

The latch circuit 233_3 may latch the mode register enable signal MRREN based on pulses of the first to third input control signals PIN<1:3>. The latch circuit 233_3 may latch the mode register enable signal MRREN when the pulse of any one of the first to third input control signals PIN<1:3> is inputted. The latch circuit 233_3 may generate the more register control signal MRR_CTR from the latched mode register enable signal MRREN based on the pulses of the first to third counting signals CNT<1:3>. The latch circuit 233_3 may output the latched mode register enable signal MRREN as the mode register control signal MRR_CTR, when the pulse of any one of the first to third counting signals CNT<1:3> is inputted.

The output control signal generation circuit 233_4 may generate the first to third output control signals POUT<1:3> from the first to third pre-output control signals PO<1:3> during a period in which the mode register control signal MRR_CTR is enabled. The output control signal generation circuit 233_4 may output the first to third pre-output control signals PO<1:3> as the first to third output control signals POUT<1:3> during a period in which the mode register control signal MRR_CTR is enabled to a logic high level. The output control signal generation circuit 233_4 may block the generation of the first to third output control signals POUT<1:3> during a period in which the mode register control signal MRR_CTR is disabled.

The output control circuit 232_2 may generate the mode register control signal MRR_CTR by latching the mode register enable signal MRREN based on the first to third input control signals PIN<1:3>. The output control circuit 232_2 may generate the first to third output control signals POUT<1:3> from the pre-input control signal PIN_PRE based on the logic level of the mode register control signal MRR_CTR.

Figure 7:
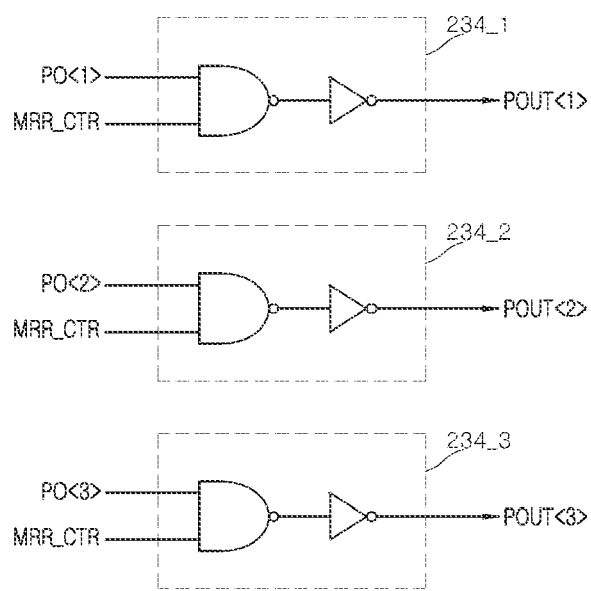
FIG. 7 is a circuit diagram, illustrating a configuration of an output control signal generation circuit that is included in an output control circuit as illustrated in FIG. 6.

Referring to FIG. 7, the output control signal generation circuit 233_4 may include a first logic circuit 234_1, a second logic circuit 234_2 and a third logic circuit 234_3.

The first logic circuit 234_1 may generate the first output control signal POUT<1> from the first pre-output control signal PO<1> during a period in which the mode register control signal MRR_CTR is enabled. The first logic circuit 234_1 may generate the first output control signal POUT<1> by buffering the first pre-output control signal PO<1> during a period in which the mode register control signal MRR_CTR is enabled to a logic high level. The first logic circuit 234_1 may block the generation of the first output control signal POUT<1> during a period in which the mode register control signal MRR_CTR is disabled to a logic low level. The first logic circuit 234_1 may generate the first output control signal POUT<1> by performing an AND operation on the mode register control signal MRR_CTR and the first pre-output control signal PO<1>.

The second logic circuit 234_2 may generate the second output control signal POUT<2> from the second pre-output control signal PO<2> during a period in which the mode register control signal MRR_CTR is enabled. The second logic circuit 234_2 may generate the second output control signal POUT<2> by buffering the second pre-output control signal PO<2> during a period in which the mode register control signal MRR_CTR is enabled to a logic high level. The second logic circuit 234_2 may block the generation of the second output control signal POUT<2> during a period in which the mode register control signal MRR_CTR is disabled to a logic low level. The second logic circuit 234_2 may generate the second output control signal POUT<2> by performing an AND operation on the mode register control signal MRR_CTR and the second pre-output control signal PO<2>.

The third logic circuit 234_3 may generate the third output control signal POUT<3> from the third pre-output control signal PO<3> during a period in which the mode register control signal MRR_CTR is enabled. The third logic circuit 234_3 may generate the third output control signal POUT<3> by buffering the third pre-output control signal PO<3> during a period in which the mode register control signal MRR_CTR is enabled to a logic high level. The third logic circuit 234_3 may block the generation of the third output control signal POUT<3> during a period in which the mode register control signal MRR_CTR is disabled to a logic low level. The third logic circuit 234_3 may generate the third output control signal POUT<3> by performing an AND operation on the mode register control signal MRR_CTR and the third pre-output control signal PO<3>.

Figure 8:
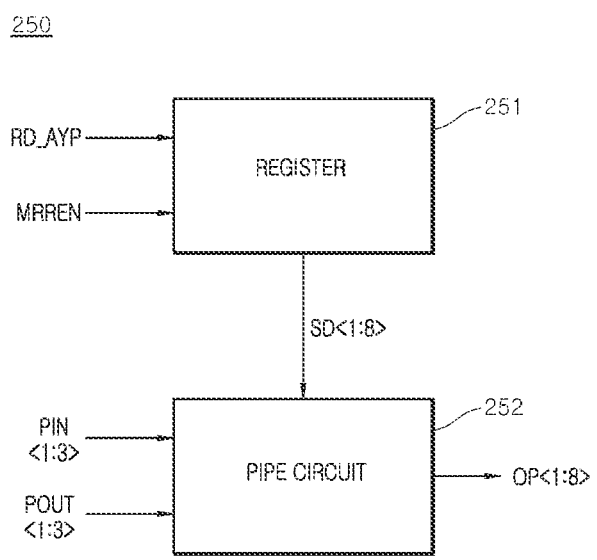
FIG. 8 is a block diagram, illustrating a configuration of an operation code generation circuit that is included in the semiconductor device as illustrated in FIG. 2.

Referring to FIG. 8, the operation code generation circuit 250 may include a register 251 and a pipe circuit 252.

The register 251 may output the storage data SD<1:8>, stored therein, during the mode register read operation. The register 251 may output the storage data SD<1:8>, stored therein, based on the logic levels of the mode register enable signal MRREN and the column control pulse RD_AYP. The register 251 may output the storage data SD<1:8>, stored therein, when the mode register enable signal MRREN is enabled to a logic high level and a pulse of the column control pulse RD_AYP is inputted at a logic high level. The storage data SD<1:8> may be set to a signal with internal information and operation information of the semiconductor device 120.

The pipe circuit 252 may latch the storage data SD<1:8> based on the first to third input control signals PIN<1:3>. The pipe circuit 252 may latch the storage data SD<1:8> when a pulse of any one of the first to third input control signals PIN<1:3> is inputted. The pipe circuit 252 may output the latched storage data SD<1:8> as the operation code OP<1:8> based on the first to third output control signals POUT<1:3>. The pipe circuit 252 may output the latched storage data SD<1:8> as the operation code OP<1:8> when a pulse of any one of the first to third output control signals POUT<1:3> is inputted.

Figure 9:
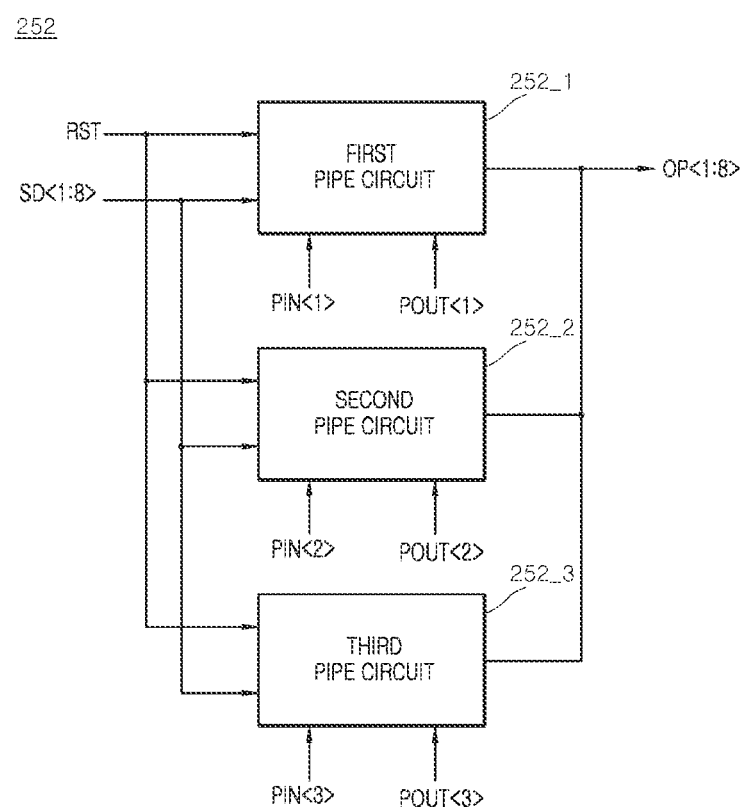
FIG. 9 is a block diagram, illustrating a configuration of a pipe circuit that is included in the operation code generation circuit as illustrated in FIG. 8.

Referring to FIG. 9, the pipe circuit 252 may include a first pipe circuit 252_1, a second pipe circuit 252_2 and a third pipe circuit 252_3.

The first pipe circuit 252_1 may latch the storage data SD<1:8> based on the first input control signal PIN<1>. The first pipe circuit 252_1 may latch the storage data SD<1:8> when a pulse of the first input control signal PIN<1> is inputted. The first pipe circuit 252_1 may output the latched storage data SD<1:8> as the operation code OP<1:8> based on the first output control signal POUT<1>. The first pipe circuit 252_1 may output the latched storage data SD<1:8> as the operation code OP<1:8> when a pulse of the first output control signal POUT<1> is inputted. The first pipe circuit 252_1 may generate the operation code OP<1:8> that is reset by a reset signal RST.

The second pipe circuit 2522 may latch the storage data SD<1:8> based on the second input control signal PIN<2>. The second pipe circuit 2522 may latch the storage data SD<1:8> when a pulse of the second input control signal PIN<2> is inputted. The second pipe circuit 252_2 may output the latched storage data SD<1:8> as the operation code OP<1:8> based on the second output control signal POUT<2>. The second pipe circuit 252_2 may output the latched storage data SD<1:8> as the operation code OP<1: 8> when a pulse of the second output control signal POUT<2> is inputted. The second pipe circuit 252_2 may generate the operation code OP<1:8> that is reset by the reset signal RST.

The third pipe circuit 252_3 may latch the storage data SD<1:8> based on the third input control signal PIN<3>. The third pipe circuit 252_3 may latch the storage data SD<1:8> when a pulse of the third input control signal PIN<3> is inputted. The third pipe circuit 252_3 may output the latched storage data SD<1:8> as the operation code OP<1:8> based on the third output control signal POUT<3>. The third pipe circuit 252_3 may output the latched storage data SD<1:8> as the operation code OP<1:8> when a pulse of the third output control signal POUT<3> is inputted. The third pipe circuit 252_3 may generate the operation code OP<1:8> that is reset by the reset signal RST.

Figure 10:
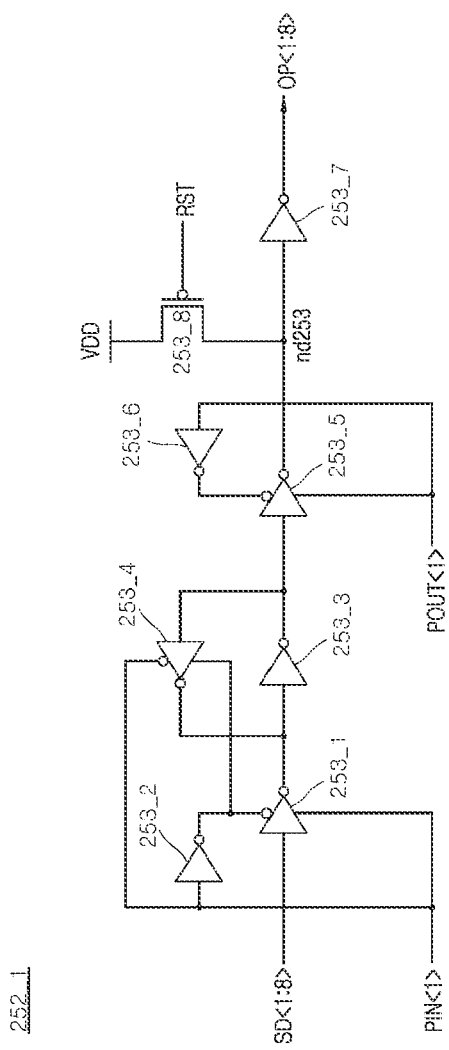
FIG. 10 is a circuit diagram, illustrating a configuration of a first pipe circuit included in the pipe circuit illustrated in FIG. 9.

Referring to FIG. 10, the first pipe circuit 252_1 may include inverters 253_1 to 253_7 and a PMOS transistor 253_8.

The first pipe circuit 252_1 may receive the storage data SD<1:8> through the inverters 253_1 and 253_2 when the first input control signal PIN<1> is inputted at a logic high level. When the first input control signal PIN<1> is inputted at a logic high level, the inverter 253_1 may be turned on to invert and buffer the storage data SD<1:8> and may be outputted the inverted and buffered data.

The first pipe circuit 252_1 may latch the received storage data SD<1:8> through the inverters 253_3 and 253_4 when the first input control signal PIN<1> is inputted at a logic low level. The inverter 253_3 may invert and buffer an output signal of the inverter 253_1 and may output the inverted and buffered signal. When the first input control signal PIN<1> is inputted at a logic low level, the inverters 253_3 and 253_4 may be turned on to latch the output signal of the inverter 253_1.

The first pipe circuit 252_1 may generate the operation code OP<1:8> by buffering the output signal of the inverter 253_3 through the inverters 253_5 to 253_7, when the first output control signal POUT<1> is inputted at a logic high level. When the first output control signal POUT<1> is inputted at a logic high level, the inverter 253_5 may be turned on to invert and buffer the output signal of the inverter 253_3 and may be outputted the inverted and buffered signal to a node nd253. The inverter 253_7 may generate the operation code OP<1:8> by inverting and buffering the signal of the node nd253.

When the reset signal RST is inputted at a logic low level, the PMOS transistor 253_8 of the first pipe circuit 252_1 may be turned on to drive the node nd253 at the level of a supply voltage VDD. The first pipe circuit 252_1 may generate the operation code OP<1:8> that is reset to a logic low level by inverting and buffering the signal of the node nd253. The reset signal RST may be set to a signal with a pulse that is generated at a logic low level at the time of an initialization operation in which the electronic device 100 starts an operation.

Since the second and third pipe circuits 252_2 and 252_3 illustrated in FIG. 9 are configured as the same circuits as the first pipe circuit 252_1 illustrated in FIG. 10 and perform the same operation as the first pipe circuit 252_1 except input/output signals, the detailed descriptions thereof will be omitted herein.

Figure 11:
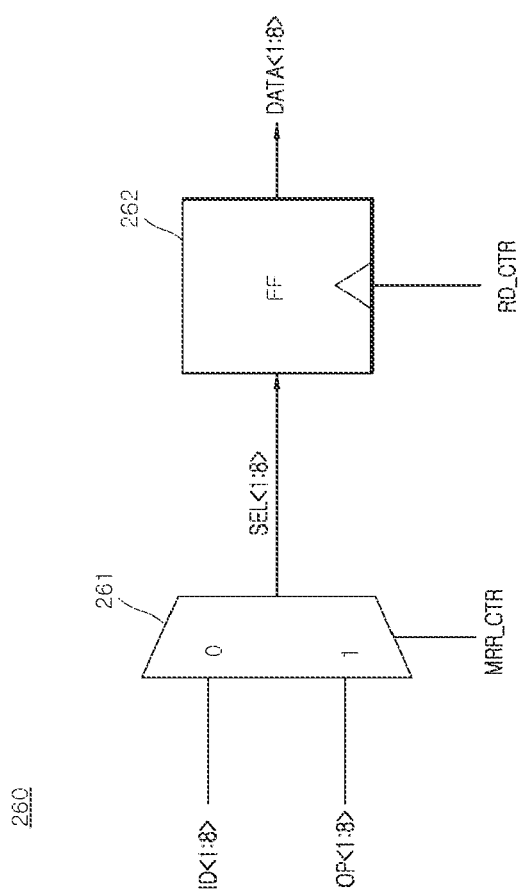
FIG. 11 is a block diagram, illustrating a configuration of an input/output circuit that is included in the semiconductor device as illustrated in FIG. 2.

Referring to FIG. 11, the input/output circuit 260 may include a selection transfer circuit 261 and a synchronization circuit 262.

The selection transfer circuit 261 may output any one of the internal data ID<1:8> and the operation code OP<1:8> as selection data SEL<1:8> based on the logic level of the mode register control signal MRR_CTR. The selection transfer circuit 261 may output the internal data ID<1:8> as the selection data SEL<1:8> when the mode register control signal MRR_CTR is disabled to a logic low level. The selection transfer circuit 261 may output the operation code OP<1:8> as the selection data SEL<1:8> when the mode register control signal MRR_CTR is enabled to a logic high level.

The synchronization circuit 262 may generate the data DATA<1:8> from the selection data SEL<1:8> in synchronization with the read control signal RD_CTR. The synchronization circuit 262 may output the selection data SEL<1:8> as the data DATA<1:8> in synchronization with the point of time that the read control signal RD_CTR is inputted at a logic high level.

Figure 12:
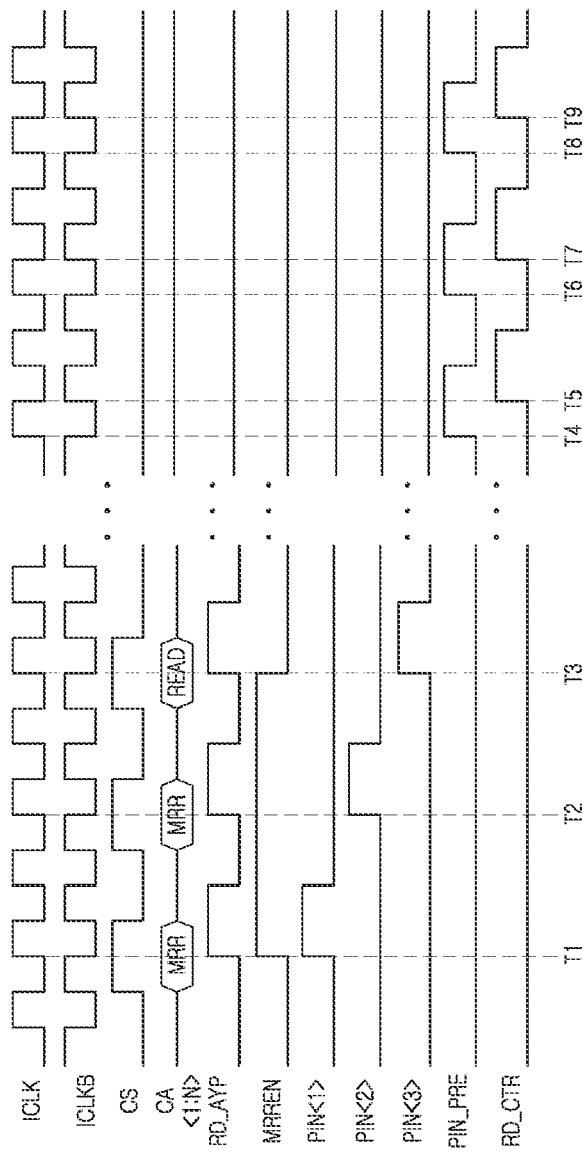
FIGS. 12 and 13 are timing diagrams for describing an operation of the electronic device in accordance with the present embodiment.
Figure 13:
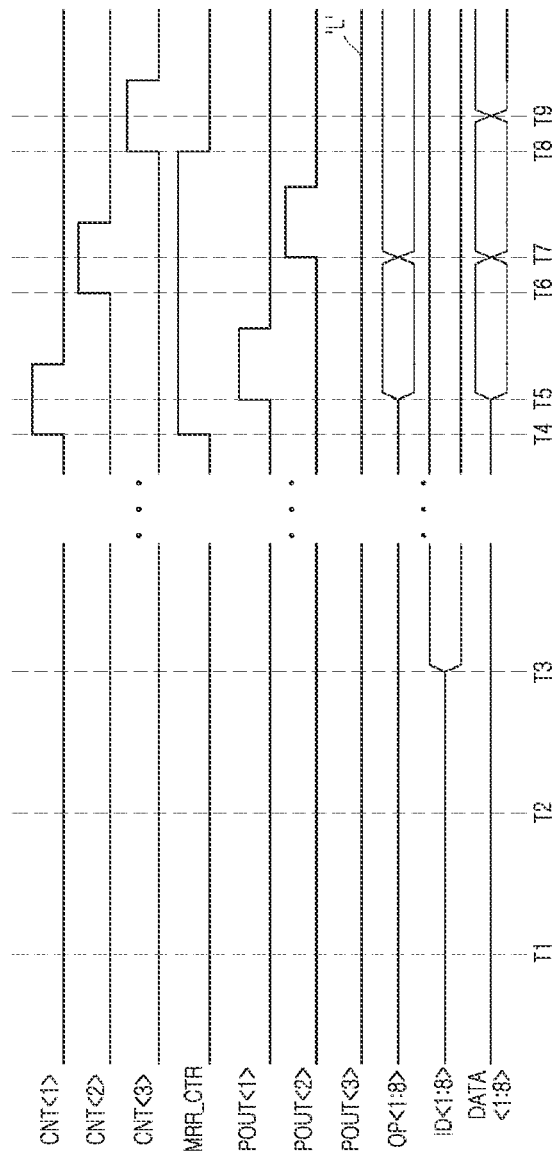

Referring to FIGS. 12 and 13, the operation of the electronic device 100 will be described. In the following descriptions, an operation in which the read operation is performed once after the mode register read operation is performed twice will be taken as an example.

The controller 110 outputs, to the semiconductor device 120, the clock CLK, the chip selection signal CS and the command address CA<1:N> to perform a first mode register read operation MRR.

The internal clock generation circuit 210 receives the clock CLK and generates the first internal clock ICLK and the second internal clock ICLKB.

At a time point T1, the column control circuit 220 generates the column control pulse RD_AYP with a logic high-level first pulse based on the chip selection signal CS and the command address CA<1:N> to perform the mode register read operation MRR in synchronization with the first internal clock ICLK and the second internal clock ICLKB. The column control circuit 220 generates the logic high-level mode register enable signal MRREN based on the chip selection signal CS and the command address CA<1:N> to perform the mode register read operation MRR in synchronization with the first internal clock ICLK and the second internal clock ICLKB.

The register 251 of the operation code generation circuit 250 outputs the storage data SD<1:8>, stored therein, based on the logic high-level mode register enable signal MRREN and the logic high-level column control pulse RD_AYP.

The pipe control circuit 232 of the control circuit 230 generates the first input control signal PIN<1> that is enabled to a logic high level by the first pulse of the column control pulse RD_AYP.

The latch circuit 233_3 of the output control circuit 232_2 latches the mode register enable signal MRREN based on the pulse of the first input control signal PIN<1>.

The pipe circuit 252 of the operation code generation circuit 250 latches the storage data SD<1:8> based on the logic high-level first input control signal PIN<1>.

The controller 110 outputs, to the semiconductor device 120, the clock CLK, the chip selection signal CS and the command address CA<1:N> to perform a second mode register read operation MRR.

At a time point T2, the column control circuit 220 generates the column control pulse RD_AYP with a logic high-level second pulse based on the chip selection signal CS and the command address CA<1:N> to perform the mode register read operation MRR in synchronization with the first internal clock ICLK and the second internal clock ICLKB. The column control circuit 220 generates the logic high-level mode register enable signal MRREN based on the chip selection signal CS and the command address CA<1:N> to perform the mode register read operation MRR in synchronization with the first internal clock ICLK and the second internal clock ICLKB.

The register 251 of the operation code generation circuit 250 outputs the storage data SD<1:8>, stored therein, based on the logic high-level mode register enable signal MRREN and the logic high-level column control pulse RD_AYP.

The pipe control circuit 232 of the control circuit 230 generates the second input control signal PIN<2> that is enabled to a logic high level by the second pulse of the column control pulse RD_AYP.

The pipe circuit 252 of the operation code generation circuit 250 latches the storage data SD<1:8> based on the logic high-level second input control signal PIN<2>.

The controller 110 outputs, to the semiconductor device 120, the clock CLK, the chip selection signal CS and the command address CA<1:N> to perform a first read operation READ.

At a time point T3, the column control circuit 220 generates the column control pulse RD_AYP with a logic high-level third pulse based on the chip selection signal CS and the command address CA<1:N> to perform the read operation READ in synchronization with the first internal clock ICLK and the second internal clock ICLKB. The column control circuit 220 generates the logic low-level mode register enable signal MRREN based on the chip selection signal CS and the command address CA<1:N> to perform the read operation READ in synchronization with the first internal clock ICLK and the second internal clock ICLKB.

The core circuit 240 outputs the internal data ID<1:8>, stored therein, based on the logic low-level mode register enable signal MRREN and the logic high-level column control pulse RD_AYP.

The pipe control circuit 232 of the control circuit 230 generates the third input control signal PIN<3> that is enabled to a logic high level by a third pulse of the column control pulse RD_AYP.

At a time point T4, the delay circuit 231 generates the pre-input control signal PIN_PRE with a logic high-level first pulse by delaying the column control pulse RD_AYP at the time point T1.

The output control circuit 232_2 generates the first counting signal CNT<1> that is counted at a logic high level by the first pulse of the pre-input control signal PIN_PRE.

The latch circuit 233_3 of the output control circuit 232_2 generates the logic high-level mode register control signal MRR_CTR from the latched mode register enable signal MRREN based on the logic high-level first counting signal CNT<1>.

At a time point T5, the delay circuit 231 generates the read control signal RD_CTR with a logic high-level first pulse by delaying the pre-input control signal PIN_PRE of the time point T4.

The output control circuit 232_2 generates the logic high-level first output control signal POUT<1> from the first counting signal CNT<1> based on the logic high-level mode register control signal MRR_CTR.

The pipe circuit 252 of the operation code generation circuit 250 generates the operation code OP<1:8> from the storage data SD<1:8> latched at the time point T1, based on the logic high-level first output control signal POUT<1>.

The selection transfer circuit 261 of the input/output circuit 260 outputs the operation code OP<1:8> as the selection data SEL<1:8> based on the logic high-level mode register control signal MRR_CTR.

The synchronization circuit 262 of the input/output circuit 260 outputs the selection data SEL<1:8> as the data DATA<1:8> in synchronization with the logic high-level read control signal RD_CTR.

At a time point T6, the delay circuit 231 generates the pre-input control signal PIN_PRE with a logic high-level second pulse by delaying the column control pulse RD_AYP of the time point T2.

The output control circuit 232_2 generates the second counting signal CNT<2> that is counted at a logic high level by the second pulse of the pre-input control signal PIN_PRE.

The latch circuit 233_3 of the output control circuit 232_2 generates the logic high-level mode register control signal MRR_CTR from the latched mode register enable signal MRREN based on the logic high-level second counting signal CNT<2>.

At a time point T7, the delay circuit 231 generates the read control signal RD_CTR with a high-level second pulse by delaying the pre-input control signal PIN_PRE of the time point T6.

The output control circuit 232_2 generates the logic high-level second output control signal POUT<2> from the second counting signal CNT<2> based on the logic high-level mode register control signal MRR_CTR.

The pipe circuit 252 of the operation code generation circuit 250 generates the operation code OP<1:8> from the storage data SD<1:8> latched at the time point T2, based on the logic high-level second output control signal POUT<2>.

The selection transfer circuit 261 of the input/output circuit 260 outputs the operation code OP<1:8> as the selection data SEL<1:8> based on the high-level mode register control signal MRR_CTR.

The synchronization circuit 262 of the input/output circuit 260 outputs the selection data SEL<1:8> as the data DATA<1:8> in synchronization with the logic high-level read control signal RD_CTR.

At a time point T8, the delay circuit 231 generates the pre-input control signal PIN_PRE with a logic high-level third pulse by delaying the column control pulse RD_AYP of the time point T3.

The output control circuit 232_2 generates the third counting signal CNT<3> that is counted at a logic high level by the third pulse of the pre-input control signal PIN_PRE.

The latch circuit 233_3 of the output control circuit 232_2 generates the logic low-level mode register control signal MRR_CTR from the latched mode register enable signal MRREN based on the logic high-level third counting signal CNT<3>.

At a time point T9, the delay circuit 231 generates the read control signal RD_CTR with a logic high-level third pulse by delaying the pre-input control signal PIN_PRE of the time point T8.

The output control circuit 232_2 generates the logic low-level third output control signal POUT<3> based on the logic low-level mode register control signal MRR_CTR.

The pipe circuit 252 of the operation code generation circuit 250 does not generate the operation code OP<1:8> based on the logic low-level third output control signal POUT<3>.

The selection transfer circuit 261 of the input/output circuit 260 outputs the internal data ID<1:8> as the selection data SEL<1:8> based on the logic low-level mode register control signal MRR_CTR.

The synchronization circuit 262 of the input/output circuit 260 outputs the selection data SEL<1:8> as the data DATA<1:8> in synchronization with the logic high-level read control signal RD_CTR.

The electronic device 100 may generate the signal to perform the read operation and the mode register read operation by delaying the signal through one delay circuit, thereby reducing the area.

Figure 14:
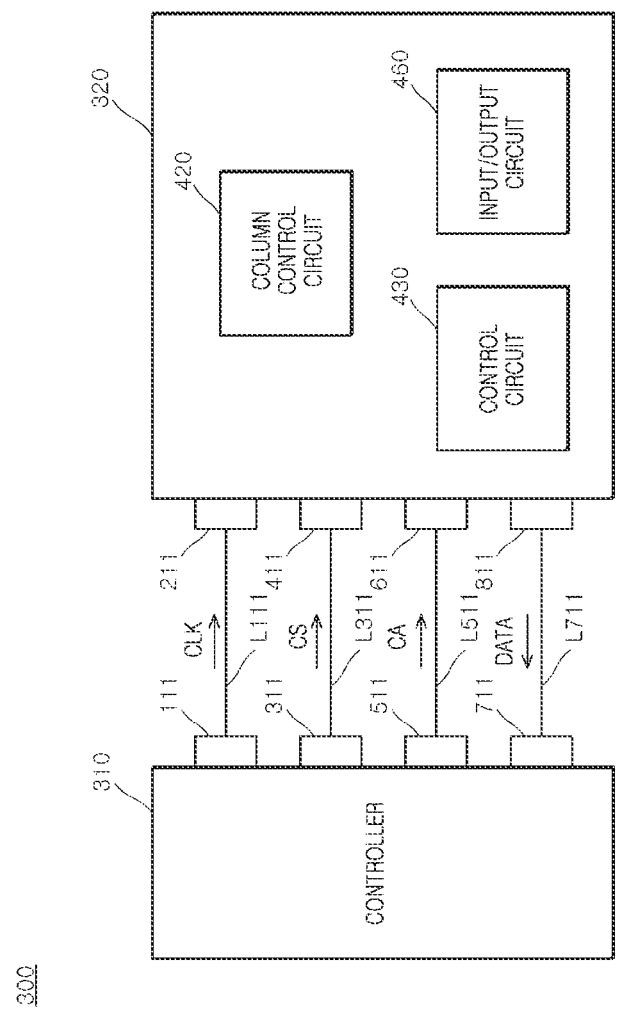
FIG. 14 is a block diagram illustrating a configuration of an electronic device in accordance with another embodiment.

As illustrated in FIG. 14, an electronic device 300 in accordance with an embodiment may include a controller 310 and a semiconductor device 320. The semiconductor device 320 may include a column control circuit 420, a control circuit 430, and an input/output circuit 460.

The controller 310 may include a first control pin 111, a second control pin 311, a third control pin 511, and a fourth control pin 711. The semiconductor device 320 may include a first semiconductor pin 211, a second semiconductor pin 411, a third semiconductor pin 611, and a fourth semiconductor pin 811. A first transmitting line L111 may be coupled between the first control pin 111 and the first semiconductor pin 211. A second transmitting line L311 may be coupled between the second control pin 311 and the second semiconductor pin 411. A third transmitting line L511 may be coupled between the third control pin 511 and the third semiconductor pin 611. A fourth transmitting line L711 may be coupled between the fourth control pin 711 and the fourth semiconductor pin 811. The controller 310 may transmit a clock CLK to the semiconductor device 320 through the first transmitting line L11, in order to control the semiconductor device 320. The controller 310 may transmit a chip selection signal CS to the semiconductor device 320 through the second transmitting line L31, in order to control the semiconductor device 320. The controller 310 may transmit a command address CA to the semiconductor device 320 through the third transmitting line L51, in order to control the semiconductor device 320. The controller 310 may receive data DATA from the semiconductor device 320 through the fourth transmitting line L71.

The controller 310 may output the clock CLK, the chip selection signal CS, and the command address CA to the semiconductor device 320 in order to perform a read operation and a mode register read operation. The controller 310 may receive the data DATA from the semiconductor device 320 during the read operation and the mode register read operation. The chip selection signal CS and the command address CA may be successively outputted in synchronization with odd pulses or even pulses of the clock CLK.

The column control circuit 420 may generate a column control pulse (RD_AYP of FIG. 15), an internal column control pulse (IRD_AYP of FIG. 15), and a mode register enable signal (MRREN of FIG. 15) according to a logic level combination of the chip selection signal CS and the command address CA. The column control circuit 420 may generate the column control pulse RD_AYP when the logic level combination of the chip selection signal CS and the command address CA corresponds to a combination for performing the read operation and the mode register read operation. The column control circuit 420 may generate the mode register enable signal MRREN when the logic level combination of the chip selection signal CS and the command address CA corresponds to a combination for performing the mode register read operation.

The control circuit 430 may generate a data output control signal (RD_YI of FIG. 15) for performing the read operation based on the column control pulse RD_AYP and the internal column control pulse IRD_AYP, according to the logic level of the mode register enable signal MRREN. The control circuit 430 may generate a read control signal (RD_CTR of FIG. 15) for the read operation based on any one of the column control pulse RD_AYP and the internal column control pulse IRD_AYP. The control circuit 430 may generate a mode register control signal (MRR_CTR of FIG. 15) for the mode register read operation based on any one of the column control pulse RD_AYP and the internal column control pulse IRD_AYP.

The input/output circuit 460 may output internal data (ID<1:8> of FIG. 15) as the data DATA during the read operation. The input/output circuit 460 may output operation codes (OP<1:8> of FIG. 15) as the data DATA during the mode register read operation.

Figure 15:
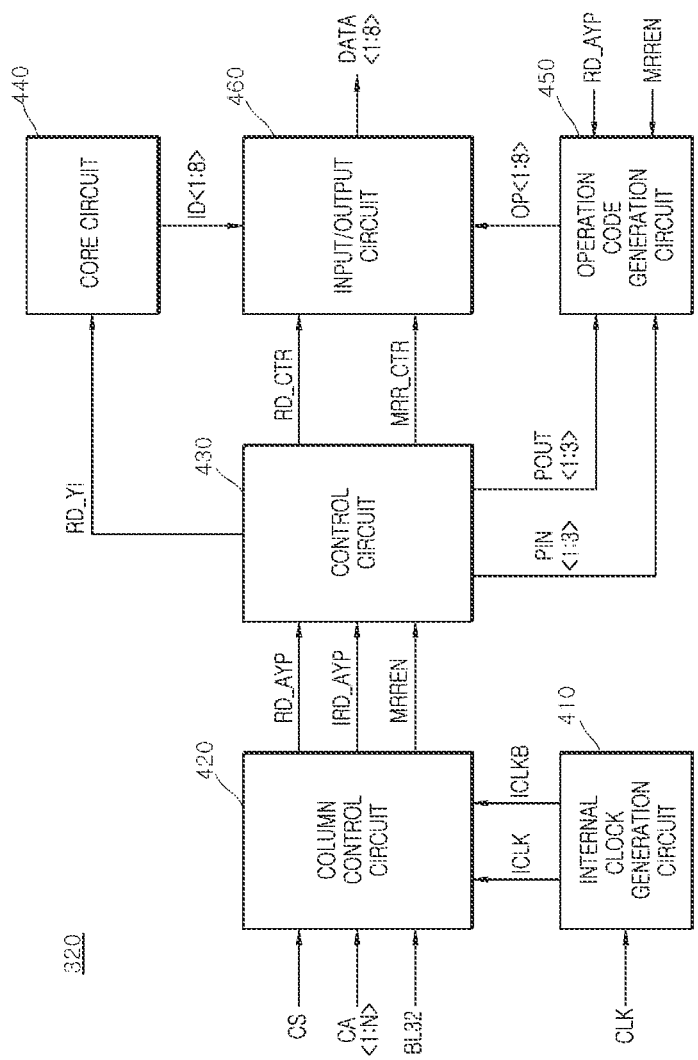
FIG. 15 is a block diagram illustrating a configuration of a semiconductor device included in the electronic device illustrated in FIG. 14.

FIG. 15 is a block diagram illustrating a configuration of the semiconductor device 320 in accordance with the present embodiment. As illustrated in FIG. 15, the semiconductor device 320 may include an internal clock generation circuit 410, the column control circuit 420, the control circuit 430, a core circuit 440, an operation code generation circuit 450, and the input/output circuit 460.

The internal clock generation circuit 410 may receive the clock CLK and may generate a first internal clock ICLK and a second internal clock ICLKB. The internal clock generation circuit 410 may generate the first and second internal clocks ICLK and ICLKB by adjusting the phase of the clock CLK. The internal clock generation circuit 410 may generate the first and second internal clocks ICLK and ICLKB by dividing the frequency of the clock CLK. The internal clock generation circuit 410 may generate the first and second internal clocks ICLK and ICLKB, each with a frequency that corresponds to ½ of the frequency of the clock CLK. The clock CLK may be set to a signal that is periodically toggled to control an operation of the electronic device 300 in accordance with the embodiment. Since the operation of the internal clock generation circuit 410 to generate the first and second internal clocks ICLK and ICLKB by dividing the frequency of the clock CLK is performed in the same manner as the above-described operation of FIG. 3, the detailed descriptions thereof will be omitted herein.

The column control circuit 420 may generate the column control pulse RD_AYP, the internal column control pulse IRD_AYP, and the mode register enable signal MRREN according to a burst control signal BL32 and a logic level combination of the chip selection signal CS and first to Nth command addresses CA<1:N>, in synchronization with the first internal clock ICLK and the second internal clock ICLKB. The column control circuit 420 may generate the column control pulse RD_AYP with a pulse that is generated when the burst control signal BL32 is disabled, and the logic level combination of the chip selection signal CS and the first to Nth command addresses CA<1:N> is a combination for performing the read operation, in synchronization with the first and second internal clocks ICLK and ICLKB. The column control circuit 420 may generate the column control pulse RD_AYP with a pulse that is generated when the burst control signal BL32 is enabled, and the logic level combination of the chip selection signal CS and the first to Nth command addresses CA<1:N> is a combination for performing the read operation, in synchronization with the first and second internal clocks ICLK and ICLKB, and then generate the internal column control pulse IRD_AYP. The column control circuit 420 may generate the column control pulse RD_AYP with a pulse that is generated when the logic level combination of the chip selection signal CS and the first to Nth command addresses CA<1:N> is a combination for performing the mode register read operation, in synchronization with the first and second internal clocks ICLK and ICLKB. The column control circuit 420 may generate the mode register enable signal MRREN that is enabled when the logic level combination of the chip selection signal CS and the first to Nth command addresses CA<1:N> is a combination for performing the mode register read operation, in synchronization with the first and second internal clocks ICLK and ICLKB. The column control pulse RD_AYP may be enabled during a first burst operation BL 8 and a second burst operation BL 16. The internal column control pulse IRD_AYP may be enabled during the second burst operation BL 16. The first burst operation BL 8 may correspond to a case in which the number of bits that are contained in data that is output during one read operation is set to 8 bits. The second burst operation BL 16 may correspond to a case in which the number of bits that are contained in data that is output during one read operation is set to 16 bits. The second burst operation BL 16 may be set to an operation that outputs data that is twice as large as the first burst operation BL 8. The number of bits that are contained in the data that is output during each of the first and second burst operations BL 8 and BL 16 may be set to various values depending on the embodiment. Pulses that are included in each of the column control pulse RD_AYP and the internal column control pulse IRD_AYP may be set to high-level pulses. The logic level at which the mode register enable signal MRREN is enabled may be set to a logic high level.

According to the logic level of the mode register enable signal MRREN, the control circuit 430 may generate the data output control signal RD_YI for the read operation based on the column control pulse RD_AYP and the internal column control pulse IRD_AYP. According to the logic level of the mode register enable signal MRREN, the control circuit 430 may generate the read control signal RD_CTR for performing the read operation from any one of the column control pulse RD_AYP and the internal column control pulse IRD_AYP. According to the logic level of the mode register enable signal MRREN, the control circuit 430 may generate the mode register control signal MRR_CTR for the mode register read operation from any one of the column control pulse RD_AYP and the internal column control pulse IRD_AYP. The control circuit 430 may generate first to third input control signals PIN<1:3>, which are sequentially enabled, based on the mode register enable signal MRREN, the column control pulse RD_AYP, and the internal column control pulse IRD_AYP. The control circuit 430 may generate first to third output control signals POUT<1:3>, which are sequentially enabled, based on the mode register enable signal MRREN, the column control pulse RD_AYP, and the internal column control pulse IRD_AYP.

The core circuit 440 may output first to eighth internal data ID<1:8>, stored therein, during the read operation according to the data output control signal RD_YI. The core circuit 440 may output the first to eighth internal data ID<1:8>, stored therein, when the data output control signal RD_YI is enabled.

The operation code generation circuit 450 may latch first to eighth storage data (SD<1:8> of FIG. 8), stored therein, based on the first to third input control signals PIN<1:3>, according to the logic levels of the column control pulse RD_AYP and the mode register enable signal MRREN. The operation code generation circuit 450 may output, as first to eighth operation codes OP<1:8>, the first to eighth storage data SD<1:8>, latched based on the first to third output control signals POUT<1:3>, according to the logic levels of the column control pulse RD_AYP and the mode register enable signal MRREN. Since the operation code generation circuit 450 is implemented with the same circuit as the operation code generation circuit 250, illustrated in FIGS. 8 to 10, and performs the same operation as the operation code generation circuit 250, the detailed descriptions thereof will be omitted herein.

During the read operation, the input/output circuit 460 may output the first to eighth internal data ID<1:8> as first to eighth data DATA<1:8> according to the logic levels of the read control signal RD_CTR and the mode register control signal MRR_CTR. During the mode register read operation, the input/output circuit 460 may output the first to eighth operation codes OP<1:8> as the first to eighth data DATA<1:8> according to the logic levels of the read control signal RD_CTR and the mode register control signal MRR_CTR.

Figure 16:
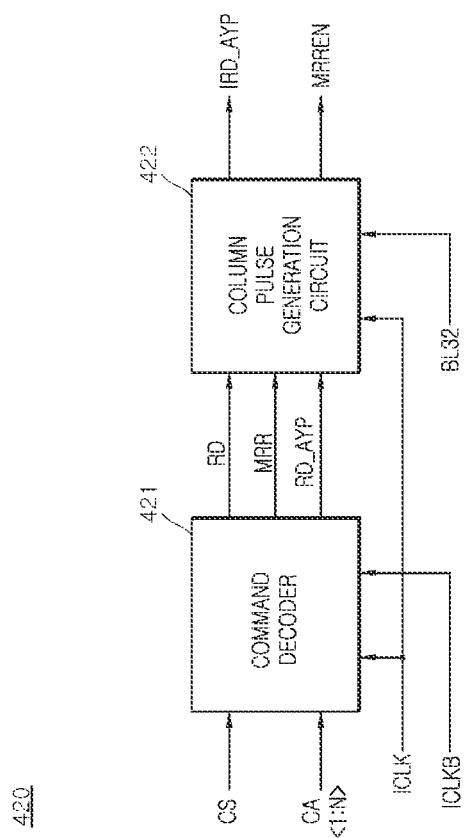
FIG. 16 is a block diagram illustrating a configuration of a column control circuit included in the semiconductor device illustrated in FIG. 15.

Referring to FIG. 16, the column control circuit 420 in accordance with the present embodiment may include a command decoder 421 and a column pulse generation circuit 422.

The command decoder 421 may generate a read command RD, a mode register read command MRR, and the column control pulse RD_AYP by decoding the chip selection signal CS and the first to Nth command addresses CA<1:N> in synchronization with any one of the first internal clock ICLK and the second internal clock ICLKB. The command decoder 421 may generate the read command RD and the column control pulse RD_AYP, each of which includes a pulse that is generated when the chip selection signal CS and the first to Nth command addresses CA<1:N> correspond to a logic level combination for performing the read operation, in synchronization with any one of the first internal clock ICLK and the second internal clock ICLKB. The command decoder 421 may generate the mode register read command MRR and the column control pulse RD_AYP, each of which includes a pulse that is generated when the chip selection signal CS and the first to Nth command addresses CA<1:N> correspond to a logic level combination for performing the mode register read operation, in synchronization with any one of the first internal clock ICLK and the second internal clock ICLKB.

When the burst control signal BL32 is enabled in synchronization with the first internal clock ICLK, the column pulse generation circuit 422 may generate the internal column control pulse IRD_AYP based on the column control pulse RD_AYP. When the burst control signal BL32 is enabled, the column pulse generation circuit 422 may generate the internal column control pulse IRD_AYP after two periods of the first internal clock ICLK from the point of time that the column control pulse RD_AYP is generated. The column pulse generation circuit 422 may generate the mode register enable signal MRREN, in synchronization with the first internal clock ICLK, based on the mode register read command MRR and the read command RD.

Figure 17:
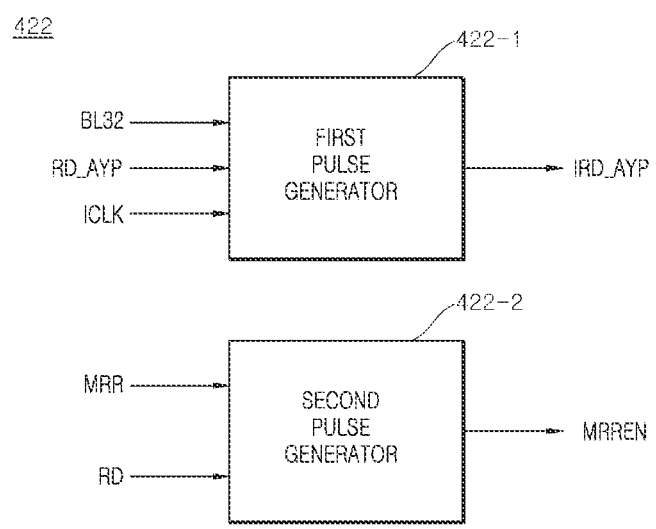
FIG. 17 is a block diagram illustrating a configuration of a column pulse generation circuit included in the column control circuit illustrated in FIG. 16.

Referring to FIG. 17, the column pulse generation circuit 422 in accordance with the present embodiment may include a first pulse generator 422-1 and a second pulse generator 422-2.

The first pulse generator 422-1 may generate the internal column control pulse IRD_AYP, in synchronization with the first internal clock ICLK, based on the burst control signal BL32 and the column control pulse RD_AYP. When the burst control signal BL32 is enabled in synchronization with the first internal clock ICLK, the first pulse generator 422-1 may generate the internal column control pulse IRD_AYP by delaying the column control pulse RD_AYP. When the burst control signal BL32 is enabled, the first pulse generator 422-1 may generate the internal column control pulse IRD_AYP by delaying the column control pulse RD_AYP by two periods of the first internal clock ICLK.

The second pulse generator 422-2 may generate the mode register enable signal MRREN based on the mode register read command MRR and the read command RD. The second pulse generator 422-2 may generate the mode register enable signal MRREN, which is enabled when the mode register read command MRR is input. The second pulse generator 422-2 may generate the mode register enable signal MRREN, which is disabled when the read command RD is input.

Figure 18:
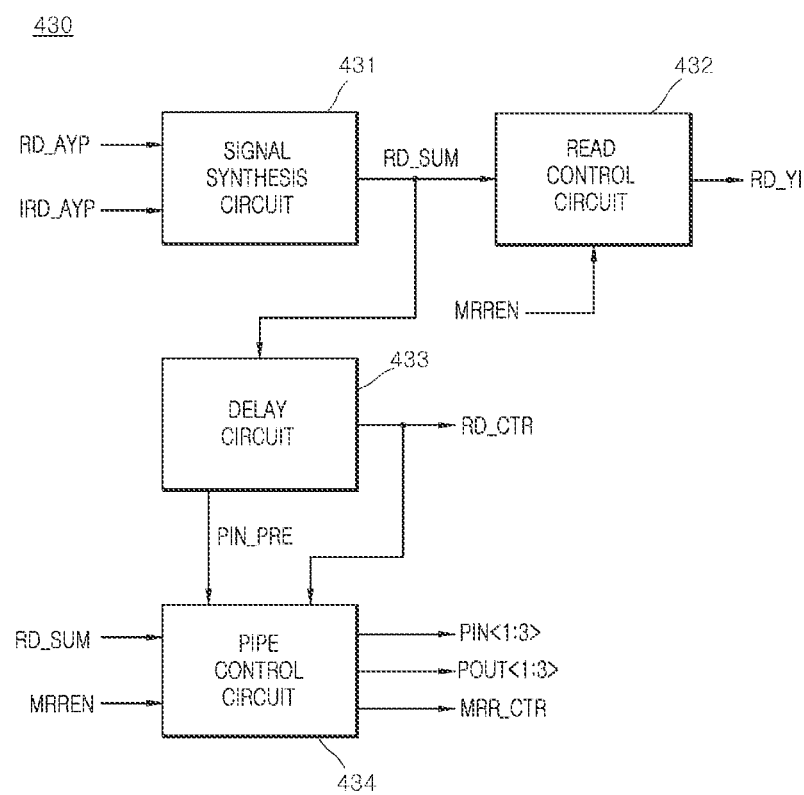
FIG. 18 is a block diagram illustrating a configuration of a control circuit included in the semiconductor device illustrated in FIG. 15.

Referring to FIG. 18, the control circuit 430 in accordance with the present embodiment may include a signal synthesis circuit 431, a read control circuit 432, a delay circuit 433, and a pipe control circuit 434.

The signal synthesis circuit 431 may generate a read sum signal RD_SUM by synthesizing the column control pulse RD_AYP and the internal column control pulse IRD_AYP. The signal synthesis circuit 431 may generate the read sum signal RD_SUM with a pulse that is generated when any one of the column control pulse RD_AYP and the internal column control pulse IRD_AYP is input.

The read control circuit 432 may generate the data that is output control signal RD_YI based on the read sum signal RD_SUM according to the logic level of the mode register enable signal MRREN. When the mode register enable signal MRREN is disabled, the read control circuit 432 may generate the data output control signal RD_YI based on the read sum signal RD_SUM. The read control circuit 432 may block the generation of the data output control signal RD_YI when the mode register enable signal MRREN is enabled.

The delay circuit 433 may generate a pre-input control signal PIN_PRE and the read control signal RD_CTR, each of which includes pulses that are sequentially generated by delaying the read sum signal RD_SUM. The delay circuit 433 may generate the pre-input control signal PIN_PRE by delaying the read sum signal RD_SUM. The delay circuit 433 may generate the read control signal RD_CTR by delaying the pre-input control signal PIN_PRE. The delay amount of the delay circuit 433 may be set to the same delay amount as the time required for the core circuit 440 to output the first to eighth internal data ID<1:8>. The delay amount of the delay circuit 433 may be set to the same delay amount as the time that is required for the operation code generation circuit 450 to output the first to eighth operation codes OP<1:8>.

The pipe control circuit 434 may generate the first to third input control signals PIN<1:3>, which are sequentially enabled during the mode register read operation. The pipe control circuit 434 may generate the first to third input control signals PIN<1:3>, which are sequentially enabled by the read sum signal RD_SUM. The pipe control circuit 434 may generate the mode register control signal MRR_CTR from the mode register enable signal MRREN according to the first to third input control signals PIN<1:3>. The pipe control circuit 434 may latch the mode register enable signal MRREN according to the first to third input control signals PIN<1:3>. The pipe control circuit 434 may generate the mode register control signal MRR_CTR from the latched mode register enable signal MRREN. The pipe control circuit 434 may generate the first to third output control signals POUT<1:3>, which are sequentially enabled during the mode register read operation. The pipe control circuit 434 may generate the first to third output control signals POUT<1:3>, which are sequentially enabled, from the mode register enable signal MRREN and the pre-input control signal PIN_PRE.

Figure 19:
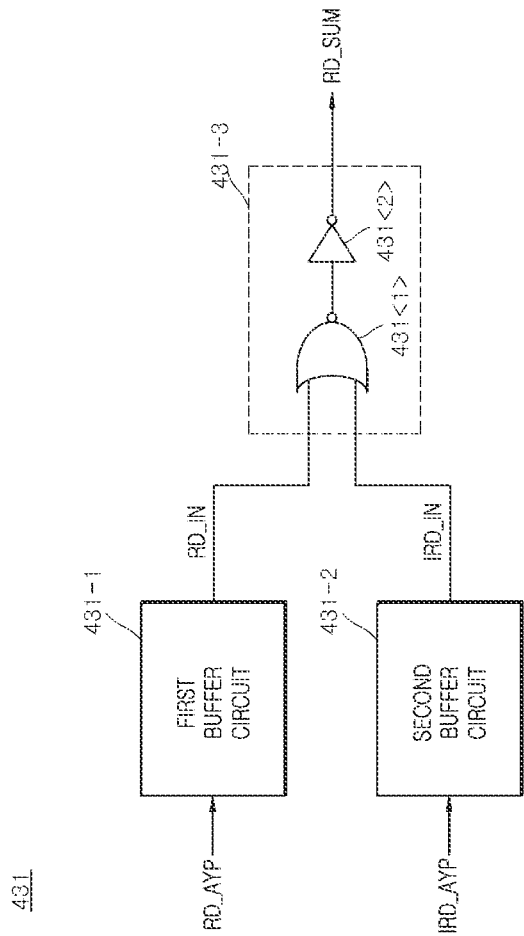
FIG. 19 is a diagram illustrating a configuration of a signal synthesis circuit included in the control circuit illustrated in FIG. 18.

Referring to FIG. 19, the signal synthesis circuit 431 in accordance with the present embodiment may include a first buffer circuit 431-1, a second buffer circuit 431-2 and a read sum signal generation circuit 431-3.

The first buffer circuit 431-1 may generate a read input signal RD_IN by buffering the column control pulse RD_AYP.

The second buffer circuit 431-2 may generate an internal read input signal IRD_IN by buffering the internal control pulse IRD_AYP.

The read sum signal generation circuit 431-3 may be implemented with a NOR gate 431<1> and an inverter 431<2>. The read sum signal generation circuit 431-3 may generate the read sum signal RD_SUM by synthesizing the read input signal RD_IN and the internal read input signal IRD_IN. When any one of the read input signal RD_IN and the internal read input signal IRD_IN is input at a logic high level, the read sum signal generation circuit 431-3 may generate the high-level read sum signal RD_SUM. The read sum signal generation circuit 431-3 may generate the read sum signal RD_SUM by performing an OR operation on the read input signal RD_IN and the internal read input signal IRD_IN.

Figure 20:
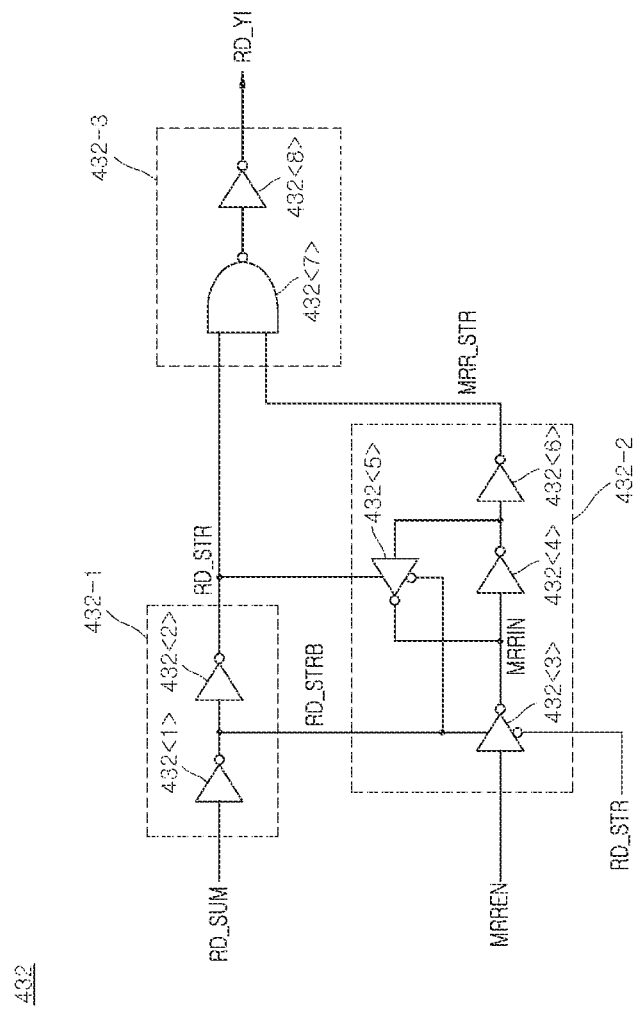
FIG. 20 is a circuit diagram illustrating a configuration of a read control circuit included in the control circuit illustrated in FIG. 18.

Referring to FIG. 20, the read control circuit 432 in accordance with the present embodiment may include a read strobe signal generation circuit 432-1, a mode register strobe signal generation circuit 432-2, and a data output control signal generation circuit 432-3.

The read strobe signal generation circuit 432-1 may be implemented with inverters 432<1> and 432<2>. The read strobe signal generation circuit 432-1 may generate an inverted read strobe signal RD_STRB by inverting and buffering the read sum signal RD_SUM. The read strobe signal generation circuit 432-1 may generate a read strobe signal RD_STR by inverting and buffering the inverted read strobe signal RD_STRB.

The mode register strobe signal generation circuit 432-2 may be implemented with inverters 432<3>, 432<4>, 432<5> and 432<6>. The mode register strobe signal generation circuit 432-2 may receive the mode register enable signal MRREN while the inverted read strobe signal RD_STRB is at a logic high level. The mode register strobe signal generation circuit 432-2 may generate a mode register input signal MRRIN by inverting and buffering the mode register enable signal MRREN, which is input while the inverted read strobe signal RD_STRB is at a logic high level. The mode register strobe signal generation circuit 432-2 may generate a mode register strobe signal MRR_STR by buffering the mode register input signal MRRIN. The mode register strobe signal generation circuit 432-2 may latch the mode register input signal MRRIN while the read strobe signal RD_STR is at a logic high level.

The data output control signal generation circuit 432-3 may be implemented with a NAND gate 432<7> and an inverter 432<8>. The data output control signal generation circuit 432-3 may generate the data output control signal RD_YI based on the read strobe signal RD_STR while the mode register strobe signal MRR_STR is disabled at a logic high level. The data output control signal generation circuit 432-3 may block the generation of the data output control signal RD_YI while the mode register strobe signal MRR_STR is enabled at a logic low level. The data output control signal generation circuit 432-3 may generate the data output control signal RD_YI by performing an AND operation on the mode register strobe signal MRR_STR and the read strobe signal RD_STR.

Figure 21:
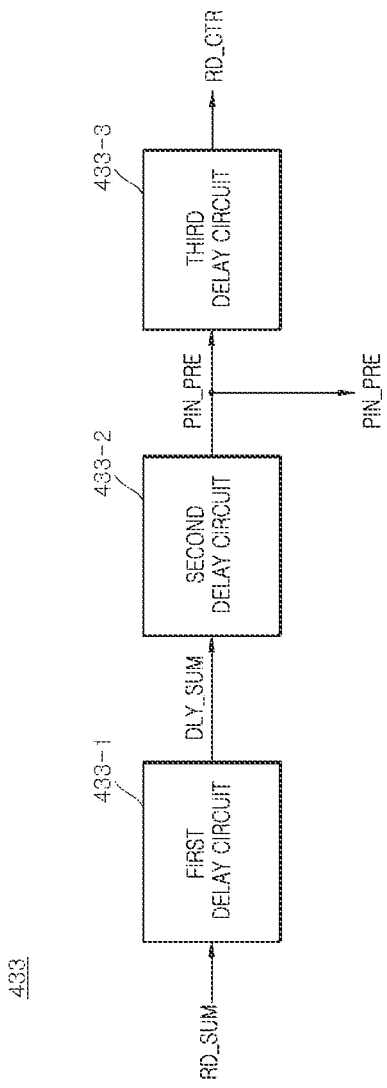
FIG. 21 is a block diagram illustrating a configuration of a delay circuit included in the control circuit illustrated in FIG. 18.

Referring to FIG. 21, the delay circuit 433 in accordance with the present embodiment may include a first delay circuit 433_1, a second delay circuit 433_2, and a third delay circuit 433_3.

The first delay circuit 433_1 may generate a delayed sum signal DLY_SUM by delaying the read sum signal RD_SUM.

The second delay circuit 433_2 may generate the pre-input control signal PIN_PRE by delaying the delayed sum signal DLY_SUM.

The third delay circuit 433_3 may generate the read control signal RD_CTR by delaying the pre-input control signal PIN_PRE.

The first to third delay circuits 433_1 to 433_3 may be configured to have the same delay amount. The sum of the delay amounts of the first to third delay circuits 433_1 to 433_3 may be set to the same delay amount as the time that is required for the core circuit 440 to output the first to eighth internal data ID<1:8>. The sum of the delay amounts of the first to third delay circuits 433_1 to 433_3 may be set to the same delay amount as the time that is required for the operation code generation circuit 450 to output the first to eighth operation codes OP<1:8>.

Figure 22:
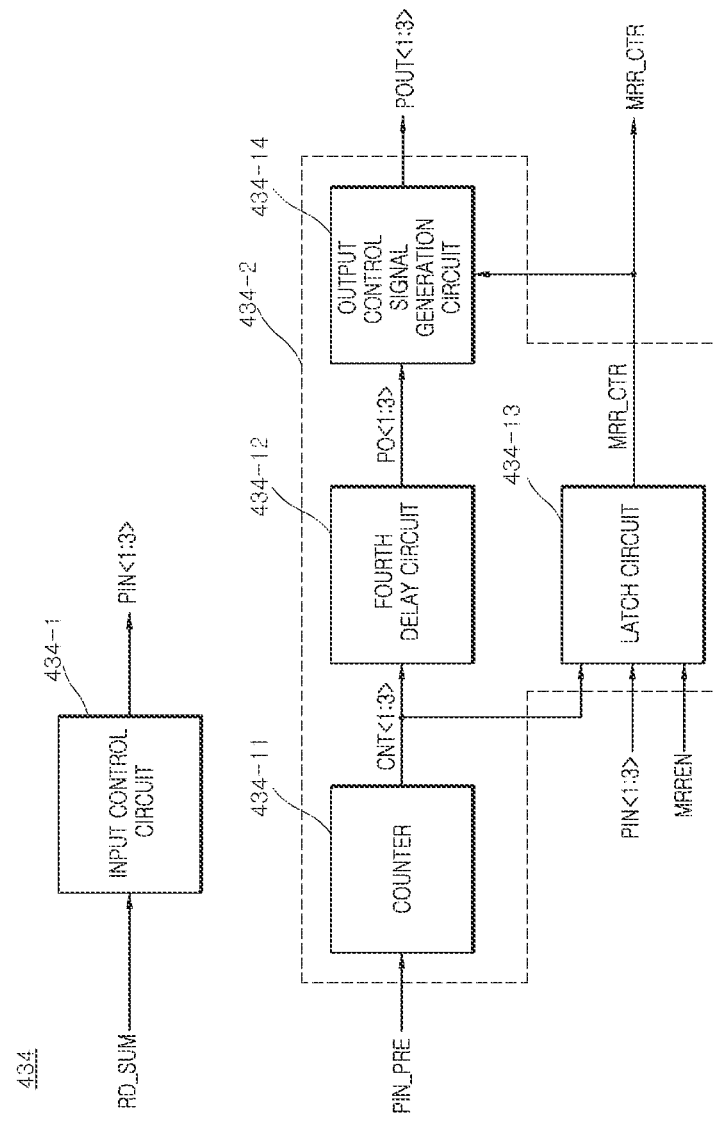
FIG. 22 is a block diagram illustrating a configuration of a pipe control circuit included in the control circuit illustrated in FIG. 18.

Referring to FIG. 22, the pipe control circuit 434 in accordance with the present embodiment may include an input control circuit 434_1 and an output control circuit 434_2. The output control circuit 434_2 may include a counter 434_11, a fourth delay circuit 434_12, a latch circuit 434_13, and an output control signal generation circuit 434_14.

The input control circuit 434_1 may generate the first to third input control signals PIN<1:3>, which are sequentially counted according to pulses of the read sum signal RD_SUM. When the pulses of the read sum signal RD_SUM are input at a logic high level, the input control circuit 434_1 may generate the first to third input control signals PIN<1:3>, which are sequentially counted. For example, the input control circuit 434_1 may enable the first input control signal PIN<1> when one pulse of the read sum signal RD_SUM is input. The input control circuit 434_1 may be implemented to enable the first input control signal PIN<1> when a pulse of the read sum signal RD_SUM is input after the third input control signal PIN<3> is enabled.

The counter 434_11 may generate first to third counting signals CNT<1:3>, which are sequentially counted according to pulses of the pre-input control signal PIN_PRE. When the pulses of the pre-input control signal PIN_PRE are input at a logic high level, the counter 434_11 may generate the first to third counting signals CNT<1:3>, which are sequentially counted. For example, the counter 434_11 may enable the first counting signal CNT<1> when one pulse of the pre-input control signal PIN_PRE is input. The counter 434_11 may be implemented to enable the first counting signal CNT<1> when a pulse of the pre-input control signal PIN_PRE is input after the third counting signal CNT<3> is enabled.

The fourth delay circuit 434_12 may generate first to third pre-output control signals PO<1:3> by delaying the first to third counting signals CNT<1:3>. Depending on embodiments, the delay amount of the fourth delay circuit 434_12 may be set to various values.

The latch circuit 434_13 may latch the mode register enable signal MRREN according to pulses of the first to third input control signals PIN<1:3>. The latch circuit 434_13 may latch the mode register enable signal MRREN when a pulse of any one of the first to third input control signals PIN<1:3> is input. The latch circuit 434_13 may generate the mode register control signal MRR_CTR from the mode register enable signal MRREN, latched based on the pulse of the first to third counting signals CNT<1:3>. The latch circuit 434_13 may output, as the mode register control signal MRR_CTR, the mode register enable signal MRREN, which is latched when the pulse of any one of the first to third counting signals CNT<1:3> is input.

The output control signal generation circuit 434_14 may generate the first to third output control signals POUT<1:3> from the first to third pre-output control signals PO<1:3> while the mode register control signal MRR_CTR is enabled. The output control signal generation circuit 434_14 may output the first to third pre-output control signals PO<1:3> as the first to third output control signals POUT<1:3> while the mode register control signal MRR_CTR is enabled at a logic high level. The output control signal generation circuit 434_14 may block the generation of the first to third output control signals POUT<1:3> while the mode register control signal MRR_CTR is disabled. Since the output control signal generation circuit 434-14 is implemented with the same circuit as the output control signal generation circuit 233_4, illustrated in FIG. 7, and performs the same operation as the output control signal generation circuit 233_4, the detailed descriptions thereof will be omitted herein.

The output control circuit 434_2 may generate the mode register control signal MRR_CTR by latching the mode register enable signal MRREN according to the first to third input control signals PIN<1:3>. The output control circuit 434_2 may generate the first to third output control signals POUT<1:3> from the pre-input control signal PIN_PRE according to the logic level of the mode register control signal MRR_CTR.

Figure 23:
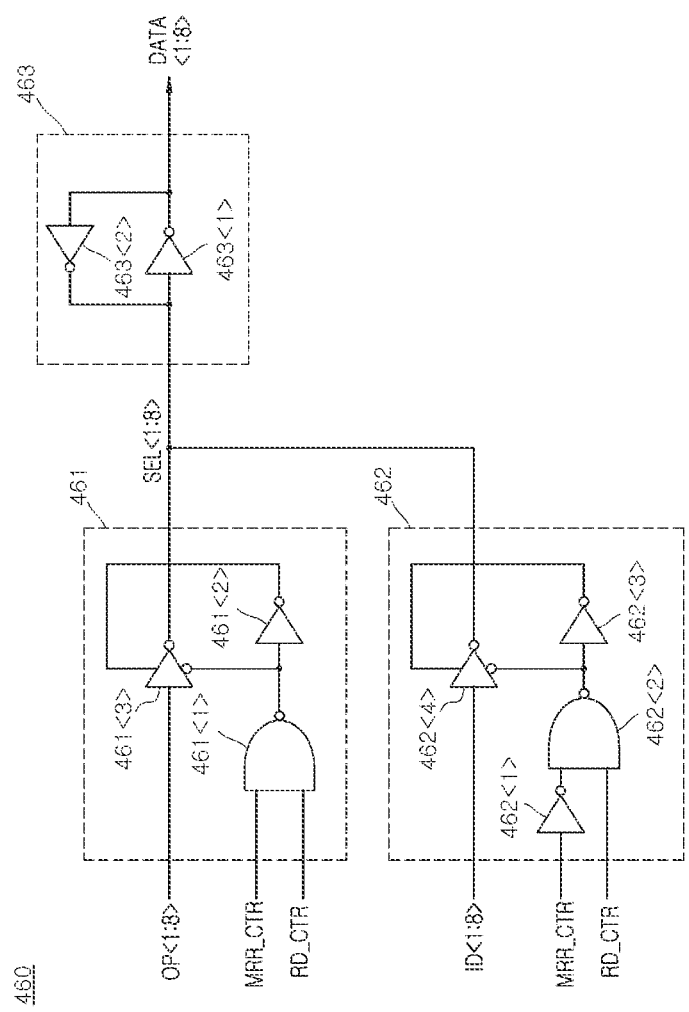
FIG. 23 is a circuit diagram illustrating a configuration of an input/output circuit included in the semiconductor device illustrated in FIG. 15.

Referring to FIG. 23, the input/output circuit 460 may include a first selection transfer circuit 461, a second selection transfer circuit 462 and a data output circuit 463.

The first selection transfer circuit 461 may be implemented with a NAND gate 461<1> and inverters 461<2> and 461<3>. The first selection transfer circuit 461 may generate first to eighth selection signals SEL<1:8> by inverting and buffering the first to eighth operation codes OP<1:8> according to the logic levels of the mode register control signal MRR_CTR and the read control signal RD_CTR. The first selection transfer circuit 461 may generate the first to eighth selection signals SEL<1:8> by inverting and buffering the first to eighth operation codes OP<1:8> while the mode register control signal MRR_CTR is at a logic high level, and the read control signal RD_CTR is at a logic high level.

The second selection transfer circuit 462 may be implemented with a NAND gate 462<2> and inverters 462<1>, 462<3> and 462<4>. The second selection transfer circuit 462 may generate the first to eighth selection signals SEL<1:8> by inverting and buffering the first to eighth internal data ID<1:8> according to the logic levels of the mode register control signal MRR_CTR and the read control signal RD_CTR. The second selection transfer circuit 462 may generate the first to eighth selection signals SEL<1:8> by inverting and buffering the first to eighth internal data ID<1:8> while the mode register control signal MRR_CTR is at a logic low level and the read control signal RD_CTR is at a logic high level.

The data output circuit 463 may be implemented with inverters 463<1> and 463<2>. The data output circuit 463 may latch the first to eighth selection signals SEL<1:8>. The data output circuit 463 may invert and buffer the latched first to eighth selection signals SEL<1:8>, and output the inverted signals as the first to eight data DATA<1:8>.

Figure 24:
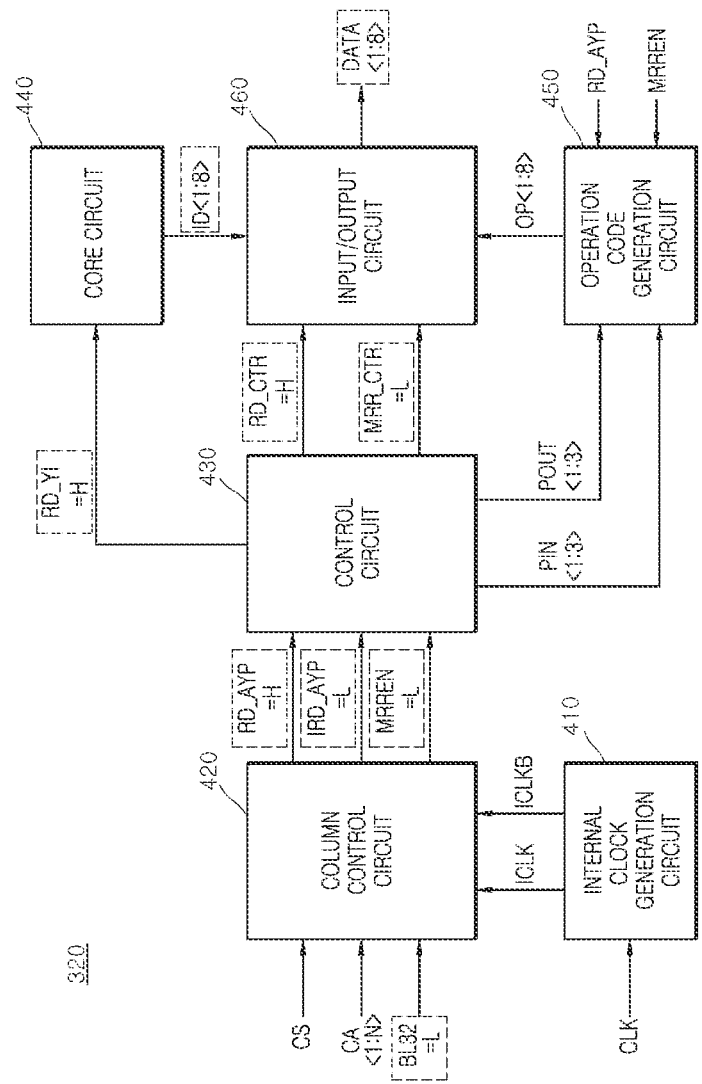
FIGS. 24 to 26 are diagrams for describing an operation of the semiconductor device in accordance with the another embodiment.

Referring to FIG. 24, the read operation of the semiconductor device 320 in accordance with the other embodiment will be described. In the following descriptions, the operation of the first burst mode BL 8 will be taken as an example.

The internal clock generation circuit 410 may generate the first internal clock ICLK and the second internal clock ICLKB by adjusting the phase of the clock CLK.

The column control circuit 420 may generate the high-level column control pulse RD_AYP, in synchronization with the first internal clock ICLK and the second internal clock ICLKB, by decoding the chip selection signal CS and the first to Nth command addresses CA<1:N>, which correspond to a combination for performing the read operation. The column control circuit 420 may generate the low-level internal column control pulse IRD_AYP based on the burst control signal BL32 being disabled to a logic low level. The column control circuit 420 may generate the low-level mode register enable signal MRREN, in synchronization with the first internal clock ICLK and the second internal clock ICLKB, by decoding the chip selection signal CS and the first to Nth command addresses CA<1:N>, which correspond to a combination for performing the read operation.

The control circuit 430 may generate the high-level data output control signal RD_YI for the read operation based on the low-level mode register enable signal MRREN and the high-level column control pulse RD_AYP. The control circuit 430 may generate the high-level read control signal RD_CTR from the low-level mode register enable signal MRREN and the high-level column control pulse RD_AYP. The control circuit 430 may generate the low-level mode register control signal MRR_CTR from the low-level mode register enable signal MRREN and the high-level column control pulse RD_AYP.

The core circuit 440 may output the first to eighth internal data ID<1:8>, stored therein, according to the high-level data output control signal RD_YI.

The input/output circuit 460 may output the first to eighth internal data ID<1:8> as the first to eighth data DATA<1:8> according to the high-level read control signal RD_CTR and the low-level mode register control signal MRR_CTR. The input/output circuit 460 may perform the first burst operation BL 8 by outputting the first to eighth data DATA<1:8> once.

Figure 25:
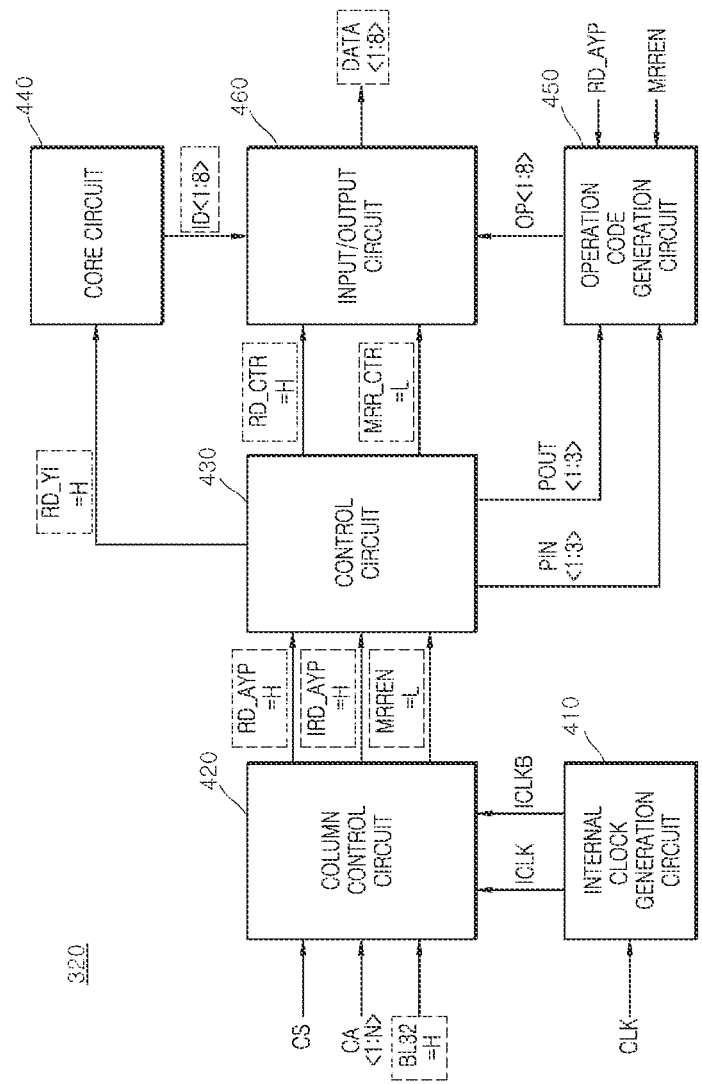

Referring to FIG. 25, the read operation of the semiconductor device 320 in accordance with the other embodiment will be described. In the following descriptions, the operation of the second burst mode BL 16 will be taken as an example.

The internal clock generation circuit 410 may generate the first internal clock ICLK and the second internal clock ICLKB by adjusting the phase of the clock CLK.

The column control circuit 420 may generate the high-level column control pulse RD_AYP, in synchronization with the first internal clock ICLK and the second internal clock ICLKB, by decoding the chip selection signal CS and the first to Nth command addresses CA<1:N>, which correspond to a combination for performing the read operation. Since the burst control signal BL32 is enabled to a logic high level, the column control circuit 420 may generate the high-level internal column control pulse IRD_AYP after generating the column control pulse RD_AYP. The column control circuit 420 may generate the low-level mode register enable signal MRREN, in synchronization with the first internal clock ICLK and the second internal clock ICLKB, by decoding the chip selection signal CS and the first to Nth command addresses CA<1:N>, which correspond to a combination for performing the read operation.

The control circuit 430 may generate the high-level data output control signal RD_YI for the read operation based on the low-level mode register enable signal MRREN and the high-level column control pulse RD_AYP and then may generate the high-level data output control signal RD_YI for the read operation based on the internal column control pulse IRD_AYP. The control circuit 430 may generate two pulses of the data output control signal RD_YI. The control circuit 430 may generate the high-level read control signal RD_CTR from the low-level mode register enable signal MRREN, the high-level column control pulse RD_AYP and the internal column control pulse IRD_AYP. The control circuit 430 may generate the low-level mode register control signal MRR_CTR from the low-level mode register enable signal MRREN, the high-level column control pulse RD_AYP, and the internal column control pulse IRD_AYP.

The core circuit 440 may output the first to eighth internal data ID<1:8>, stored therein, according to the high-level data output control signal RD_YI and then may output the first to eighth internal data ID<1:8>, stored therein, again.

The input/output circuit 460 may output the first to eighth internal data ID<1:8> as the first to eighth data DATA<1:8> according to the high-level read control signal RD_CTR and the low-level mode register control signal MRR_CTR and then may output the first to eighth internal data ID<1:8> as the first to eighth data DATA<1:8>. The input/output circuit 460 may perform the second burst operation BL 16 by outputting the first to eighth data DATA<1:8> twice.

Figure 26:
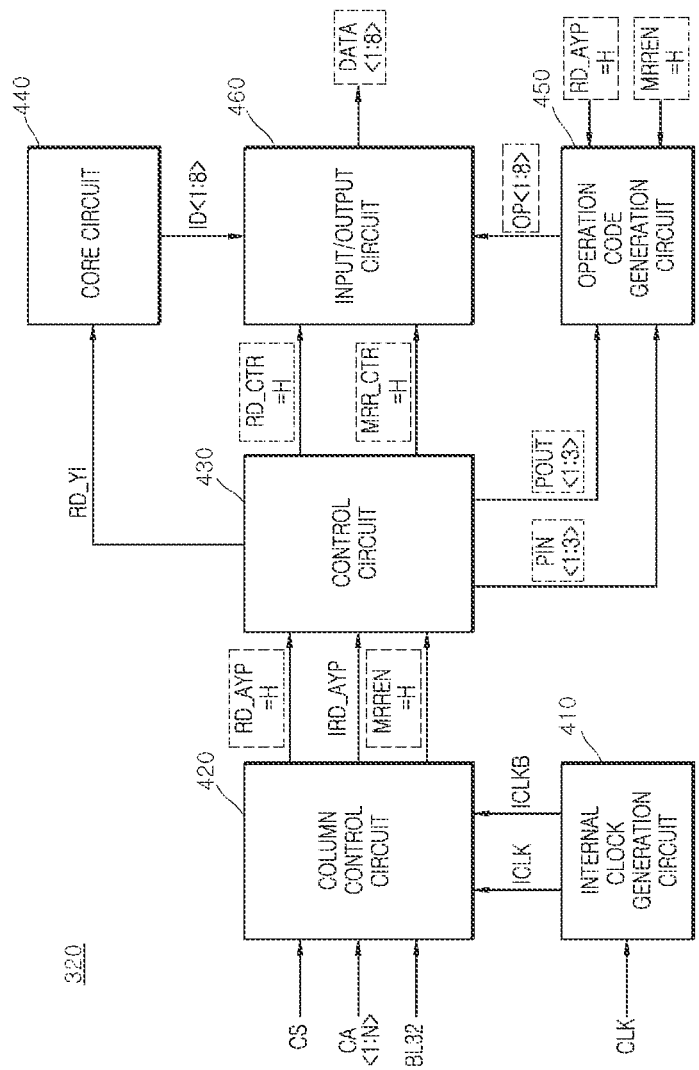

Referring to FIG. 26, the mode register read operation of the semiconductor device 320 in accordance with the other embodiment will be described as follows.

The internal clock generation circuit 410 may generate the first internal clock ICLK and the second internal clock ICLKB by adjusting the phase of the clock CLK.

The column control circuit 420 may generate the high-level column control pulse RD_AYP, in synchronization with the first internal clock ICLK and the second internal clock ICLKB, by decoding the chip selection signal CS and the first to Nth command addresses CA<1:N>, which correspond to a combination for performing the mode register read operation. The column control circuit 420 may generate the high-level mode register enable signal MRREN, in synchronization with the first internal clock ICLK and the second internal clock ICLKB, by decoding the chip selection signal CS and the first to Nth command addresses CA<1:N>, which correspond to a combination for performing the mode register read operation.

The control circuit 430 may generate the high-level read control signal RD_CTR from the high-level mode register enable signal MRREN and the high-level column control pulse RD_AYP. The control circuit 430 may generate the high-level mode register control signal MRR_CTR from the low-level mode register enable signal MRREN and the high-level column control pulse RD_AYP. The control circuit 430 may generate the first to third input control signals PIN<1:3>, which are sequentially enabled, based on the high-level mode register enable signal MRREN and the high-level column control pulse RD_AYP.

The operation code generation circuit 450 may latch the first to eighth storage data (SD<1:8> of FIG. 8), stored therein, according to the high-level column control pulse RD_AYP, the high-level mode register enable signal MRREN, and the first to third input control signals PIN<1:3>.

The control circuit 430 may generate the first to third output control signals POUT<1:3>, which are sequentially enabled, based on the high-level mode register enable signal MRREN and the high-level column control pulse RD_AYP.

The operation code generation circuit 450 may output the first to eighth storage data SD<1:8>, latched based on the first to third output control signals POUT<1:3>, as the first to eighth operation codes OP<1:8>.

The input/output circuit 460 may output the first to eighth operation codes OP<1:8> as the first to eighth data DATA<1:8> according to the high-level read control signal RD_CTR and the high-level mode register control signal MRR_CTR.

Figure 27:
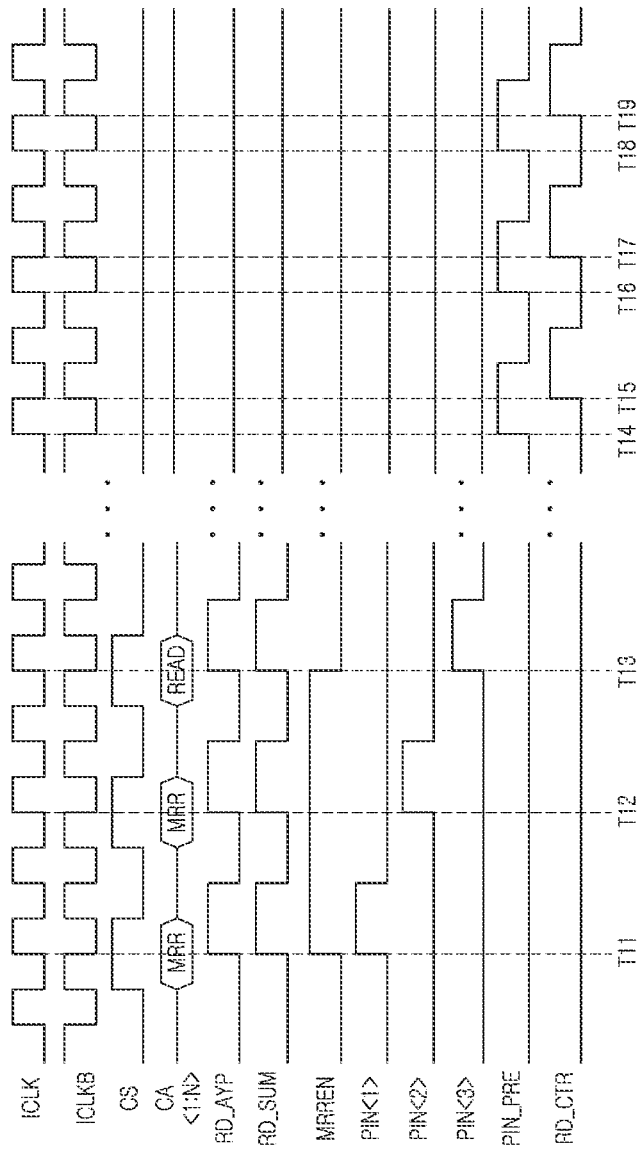
FIGS. 27 and 28 are timing diagrams for describing an operation of the semiconductor device in accordance with the another embodiment.
Figure 28:
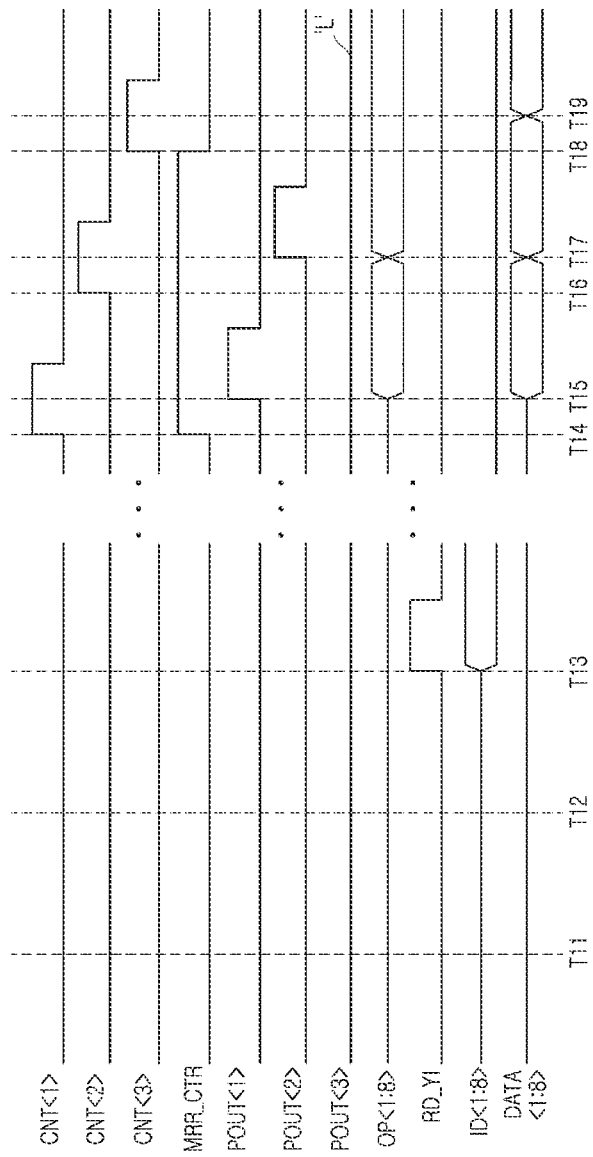

Referring to FIGS. 27 and 28, the operation of the electronic device 300 in accordance with the present embodiment will be described. In the following descriptions, a case in which the read operation of the first bust operation BL 8 is performed once after the mode register read operation is performed twice will be described as an example.

The controller 310 may output the clock CLK, the chip selection signal CS, and the first to Nth command addresses CA<1:N> to the semiconductor device 320 for a first mode register read operation MRR.

The internal clock generation circuit 410 may receive the clock CLK and generates the first internal clock ICLK and the second internal clock ICLKB.

At a time point T11, the column control circuit 420 may generate the column control pulse RD_AYP with a high-level first pulse, in synchronization with the first internal clock ICLK and the second internal clock ICLKB, by decoding the chip selection signal CS and the first to Nth command addresses CA<1:N>, which correspond to a logic level combination for performing the mode register read operation MRR. The column control circuit 420 may generate the high-level mode register enable signal MRREN by decoding the chip selection signal CS and the first to Nth command addresses CA<1:N>, which correspond to a logic level combination for performing the mode register read operation MRR, in synchronization with the first internal clock ICLK and the second internal clock ICLKB.

The register (251 of FIG. 8) of the operation code generation circuit 450 may output the first to eighth storage data (SD<1:8> of FIG. 8), stored therein, according to the high-level mode register enable signal MRREN and the high-level column control pulse RD_AYP.

The signal synthesis circuit 431 of the control circuit 430 may generate a first pulse of the read sum signal RD_SUM according to a first pulse of the column control pulse RD_AYP.

The pipe control circuit 434 of the control circuit 430 may generate the first input control signal PIN<1>, which is enabled to a logic high level by the first pulse of the read sum signal RD_SUM.

The latch circuit 434_13 of the output control circuit 434_2 may latch the mode register enable signal MRREN according to the pulse of the first input control signal PIN<1>.

The pipe circuit (252 of FIG. 8) of the operation code generation circuit 450 may latch the first to eighth storage data SD<1:8> according to the high-level first input control signal PIN<1>.

The controller 310 may output the clock CLK, the chip selection signal CS and the first to Nth command addresses CA<1:N> to the semiconductor device 320 for a second mode register read operation MRR.

At a time point T12, the column control circuit 420 may generate the column control pulse RD_AYP with a high-level second pulse, in synchronization with the first internal clock ICLK and the second internal clock ICLKB, by decoding the chip selection signal CS and the first to Nth command addresses CA<1:N>, which correspond to a logic level combination for performing the mode register read operation MRR. The column control circuit 420 may generate the high-level mode register enable signal MRREN, in synchronization with the first internal clock ICLK and the second internal clock ICLKB, by decoding the chip selection signal CS and the first to Nth command addresses CA<1:N>, which correspond to a logic level combination for performing the mode register read operation MRR.

The register 251 of the operation code generation circuit 450 may output the first to eighth storage data SD<1:8>, stored therein, according to the high-level mode register enable signal MRREN and the high-level column control pulse RD_AYP.

The signal synthesis circuit 431 of the control circuit 430 may generate a second pulse of the read sum signal RD_SUM according to a second pulse of the column control pulse RD_AYP.

The pipe control circuit 434 of the control circuit 430 may generate the second input control signal PIN<2>, which is enabled to a logic high level by the second pulse of the column control pulse RD_AYP.

The pipe circuit 252 of the operation code generation circuit 450 may latch the first to eighth storage data SD<1:8> according to the high-level second input control signal PIN<2>.

The controller 310 may output the clock CLK, the chip selection signal CS and the first to Nth command addresses CA<1:N> for a first read operation READ to the semiconductor device 320.

At a time point T13, the column control circuit 420 may generate the column control pulse RD_AYP with a high-level third pulse, in synchronization with the first internal clock ICLK and the second internal clock ICLKB, by decoding the chip selection signal CS and the first to Nth command addresses CA<1:N>, which correspond to a logic level combination for the read operation READ. The column control circuit 420 may generate the low-level mode register enable signal MRREN, in synchronization with the first internal clock ICLK and the second internal clock ICLKB, by decoding the chip selection signal CS and the first to Nth command addresses CA<1:N>, which correspond to a logic level combination for performing the read operation READ.

The signal synthesis circuit 431 of the control circuit 430 may generate a third pulse of the read sum signal RD_SUM according to a third pulse of the column control pulse RD_AYP.

The read control circuit 432 may generate the high-level data output control signal RD_YI based on the low-level mode register enable signal MRREN and the third pulse of the read sum signal RD_SUM.

The core circuit 440 may output the first to eighth internal data ID<1:8>, stored therein, according to the data output control signal RD_YI.

The pipe control circuit 434 of the control circuit 430 may generate the third input control signal PIN<3>, which is enabled to a logic high level by a third pulse of the column control pulse RD_AYP.

At a time point T14, the delay circuit 433 may generate the pre-input control signal PIN_PRE with a high-level first pulse by delaying the column control pulse RD_AYP of the time point T11.

The output control circuit 434_2 may generate the first counting signal CNT<1>, which is counted as a logic high level by the first pulse of the pre-input control signal PIN_PRE.

The latch circuit 434_13 of the output control circuit 434_2 may generate the high-level mode register control signal MRR_CTR from the mode register enable signal MRREN, latched based on the high-level first counting signal CNT<1>.

At a time point T15, the delay circuit 433 may generate the read control signal RD_CTR with a high-level first pulse by delaying the pre-input control signal PIN_PRE of the time point T14.

The output control circuit 434_2 may generate the high-level first output control signal POUT<1> from the first counting signal CNT<1> according to the high-level mode register control signal MRR_CTR.

The pipe circuit 252 of the operation code generation circuit 450 may generate the first to eighth operation codes OP<1:8> from the first to eighth storage data SD<1:8> latched at the time point T11, according to the high-level first output control signal POUT<1>.

The first selection transfer circuit 461 of the input/output circuit 460 may generate the first to eighth selection signals SEL<1:8> by inverting and buffering the first to eighth operation codes OP<1:8> while the mode register control signal MRR_CTR is at a logic high level and the read control signal RD_CTR is at a logic high level.

The data output circuit 463 of the input/output circuit 460 may latch the first to eighth selection signals SEL<1:8>. The data output circuit 463 may invert and buffer the latched first to eighth selection signals SEL<1:8> and may output the inverted signals as the first to eight data DATA<1:8>.

At a time point T16, the delay circuit 433 may generate the pre-input control signal PIN_PRE with a high-level second pulse by delaying the column control pulse RD_AYP of the time point T12.

The output control circuit 434_2 may generate the second counting signal CNT<2>, which is counted as a logic high level by the second pulse of the pre-input control signal PIN_PRE.

The latch circuit 434_13 of the output control circuit 434_2 may generate the high-level mode register control signal MRR_CTR from the mode register enable signal MRREN latched based on the high-level second counting signal CNT<2>.

At a time point T17, the delay circuit 433 may generate the read control signal RD_CTR with a high-level second pulse by delaying the pre-input control signal PIN_PRE of the time point T16.

The output control circuit 434_2 may generate the high-level second output control signal POUT<2> from the second counting signal CNT<2> according to the high-level mode register control signal MRR_CTR.

The pipe circuit 252 of the operation code generation circuit 450 may generate the first to eighth operation codes OP<1:8> from the first to eighth storage data SD<1:8>, latched at the time point T12, according to the high-level second output control signal POUT<2>.

The first selection transfer circuit 461 of the input/output circuit 460 may generate the first to eighth selection signals SEL<1:8> by inverting and buffering the first to eighth operation codes OP<1:8> while the mode register control signal MRR_CTR is at a logic high level and the read control signal RD_CTR is at a logic high level.

The data output circuit 463 of the input/output circuit 460 may latch the first to eighth selection signals SEL<1:8>. The data output circuit 463 may invert and buffer the latched first to eighth selection signals SEL<1:8> and may output the inverted signals as the first to eight data DATA<1:8>.

At a time point T18, the delay circuit 433 may generate the pre-input control signal PIN_PRE with a high-level third pulse by delaying the column control pulse RD_AYP of the time point T13.

The output control circuit 434_2 may generate the third counting signal CNT<3>, which is counted as a logic high level by the third pulse of the pre-input control signal PIN_PRE.

The latch circuit 434_13 of the output control circuit 434_2 may generate the low-level mode register control signal MRR_CTR from the mode register enable signal MRREN, latched based on the high-level third counting signal CNT<3>.

At a time point T19, the delay circuit 433 may generate the read control signal RD_CTR with a high-level third pulse by delaying the pre-input control signal PIN_PRE of the time point T18.

The output control circuit 434_2 may generate the low-level third output control signal POUT<3> according to the low-level mode register control signal MRR_CTR.

The pipe circuit 252 of the operation code generation circuit 450 might not generate the first to eighth operation codes OP<1:8> according to the low-level third output control signal POUT<3>.

The second selection transfer circuit 462 of the input/output circuit 460 may generate the first to eighth selection signals SEL<1:8> by inverting and buffering the first to eighth internal data ID<1:8> while the mode register control signal MRR_CTR is at a logic low level, and the read control signal RD_CTR is at a logic high level.

The data output circuit 463 of the input/output circuit 460 may latch the first to eighth selection signals SEL<1:8>. The data output circuit 463 may invert and buffer the latched first to eighth selection signals SEL<1:8> and may output the inverted signals as the first to eight data DATA<1:8>.

The electronic device 300, in accordance with the present embodiment, can generate the signal for the read operation or the mode register read operation, by delaying the signal through one delay circuit, thereby reducing the area.

Figure 29:
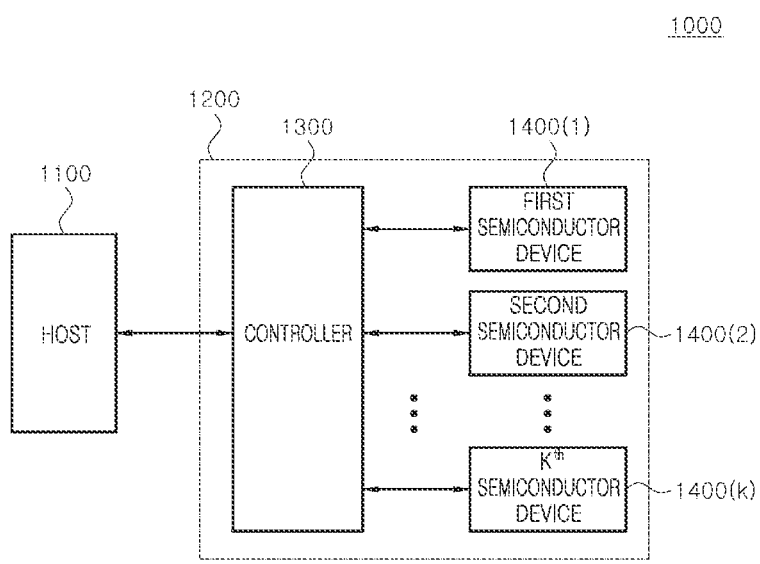
FIG. 29 is a diagram illustrating a configuration of an electronic system to which the electronic device illustrated in FIGS. 1 to 28 is applied.

FIG. 29 is a block diagram illustrating a configuration of an electronic system 1000 in accordance with an embodiment. As illustrated in FIG. 29, the electronic system 1000 may include a host 1100 and a semiconductor system 1200.

The host 1100 and the semiconductor system 1200 may transmit/receive signals to/from each other using an interface protocol. Examples of the interface protocol used between the host 1100 and the semiconductor system 1200 may include an MMC (Multi-Media Card), ESDI (Enhanced Small Disk Interface), IDE (Integrated Drive Electronics), PCI-E (Peripheral Component Interconnect-Express), ATA (Advanced Technology Attachment), SATA (Serial ATA), PATA (Parallel ATA), SAS (serial attached SCSI), USB (Universal Serial Bus) and the like.

The semiconductor system 1200 may include a controller 1300 and semiconductor devices 1400(K:1). The controller 1300 may control the semiconductor devices 1400(K:1) to perform a read operation and a mode register read operation. Each of the semiconductor devices 1400(K:1) may generate a signal for the read operation or the mode register read operation, by delaying the signal through one delay circuit, thereby reducing the area. Each of the semiconductor devices 1400(K:1) may output data generated by driving a core circuit during the read operation, and output data generated by driving an operation code generation circuit during the mode register read operation. Thus, each semiconductor device may selectively drive the core circuit and the operation code generation circuit, thereby reducing the current consumption.

The controller 1300 may be implemented with the controller 110, illustrated in FIG. 1, or the controller 310, illustrated in FIG. 14. Each of the semiconductor devices 1400(K:1) may be implemented with the semiconductor device 120, illustrated in FIG. 1, or the semiconductor device 320, illustrated in FIG. 14. According to an embodiment, each of the semiconductor devices 1400(K:1) may be implemented with one of a DRAM (dynamic random access memory), PRAM (Phase change Random Access Memory), RRAM (Resistive Random Access Memory), MRAM (Magnetic Random Access Memory) and FRAM (Ferroelectric Random Access Memory).

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. An electronic device comprising:
a column control circuit configured to generate a column control pulse, an internal column control pulse, and a mode register enable signal, each of which includes a pulse that is generated according to the logic levels of a chip selection signal and a command address; and
a control circuit configured to generate a data output control signal based on the column control pulse and the internal column control pulse according to the logic level of the mode register enable signal and configured to generate a read control signal for a read operation and a mode register control signal for a mode register read operation by delaying a read sum signal that is generated based on any one of the column control pulse and the internal column control pulse.

2. The electronic device of claim 1, wherein the column control circuit is configured to generate the column control pulse with a pulse that is generated during the read operation and the mode register read operation according to the logic levels of the chip selection signal and the command address.

3. The electronic device of claim 1, wherein the column control circuit is configured to:
when a burst control signal is disabled, generate the column control pulse for controlling a first burst operation according to the logic levels of the chip selection signal and the command address, and
when the burst control signal is enabled, generate the column control pulse for controlling the first burst operation according to the logic levels of the chip selection signal and the command address and then generate the internal column control pulse for controlling a second burst operation.

4. The electronic device of claim 1, wherein the column control circuit comprises:
a command decoder configured to generate a read command, a mode register read command, and the column control pulse by decoding the chip selection signal and the command address in synchronization with an internal clock; and a column pulse generation circuit configured to generate, when a burst control signal is enabled in synchronization with the internal clock, the internal column control pulse based on the column control pulse and generate the mode register enable signal based on the mode register read command and the read command.

5. The electronic device of claim 4, wherein the column pulse generation circuit comprises:
a first pulse generator configured to generate the internal column control pulse by delaying the column control pulse when the burst control signal is enabled in synchronization with the internal clock; and
a second pulse generator configured to generate the mode register enable signal that is enabled when the mode register read command is input and disabled when the read command is input.

6. The electronic device of claim 1, wherein the control circuit comprises:
a signal synthesis circuit configured to generate the read sum signal by synthesizing the column control pulse and the internal column control pulse;
a read control circuit configured to generate the data output control signal based on the read sum signal according to the logic level of the mode register enable signal;
a delay circuit configured to generate a pre-input control signal and the read control signal, each of which includes pulses that are sequentially generated by delaying the read sum signal; and
a pipe control circuit configured to generate a first input control signal and a second input control signal that are enabled by the read sum signal, configured to generate the mode register control signal from the mode register enable signal according to the first and second input control signals, and configured to generate a first output control signal and a second output control signal based on the mode register control signal and the pre-input control signal.

7. The electronic device of claim 6, wherein the signal synthesis circuit comprises:
a first buffer circuit configured to generate a read input signal by buffering the column control pulse;
a second buffer circuit configured to generate an internal read input signal by buffering the internal column control pulse; and
a read sum signal generation circuit configured to generate the read sum signal by synthesizing the read input signal and the internal read input signal.

8. The electronic device of claim 6, wherein the read control circuit comprises:
a read strobe signal generation circuit configured to generate an inverted read strobe signal by inverting and buffering the read sum signal and configured to generate a read strobe signal by inverting and buffering the inverted read strobe signal;
a mode register strobe signal generation circuit configured to generate a mode register strobe signal by:
latching the mode register enable signal according to the logic levels of the inverted read strobe signal and the read strobe signal, and
inverting and buffering the latched mode register enable signal; and
a data output control signal generation circuit configured to generate the data output control signal based on the read strobe signal while the mode register strobe signal is disabled.

9. The electronic device of claim 6, wherein the delay circuit comprises:
a first delay circuit configured to generate a delayed sum signal by delaying the read sum signal;
a second delay circuit configured to generate the pre-input control signal by delaying the delayed sum signal; and
a third delay circuit configured to generate the read control signal by delaying the pre-Input control signal.

10. The electronic device of claim 6, wherein the pipe control circuit comprises:
an input control circuit configured to generate the first and second input control signals, which are sequentially counted based on pulses of the read sum signal; and
an output control circuit configured to generate the mode register control signal by latching the mode register enable signal according to the first and second input control signals and configured to generate the first and second output control signals from the pre-input control signal according to the logic level of the mode register control signal.

11. The electronic device of claim 10, wherein the output control circuit comprises:
a counter configured to generate a first counting signal and a second counting signal, which are sequentially counted based on pulses of the pre-input control signal;
a fourth delay circuit configured to generate a first pre-output control signal and a second pre-output control signal by delaying the first and second counting signals;
a latch circuit configured to latch the mode register enable signal according to pulses of the first and second input control signals and configured to generate the mode register control signal based on the mode register enable signal that is latched according to pulses of the first and second counting signals; and
an output control signal generation circuit configured to generate the first and second output control signals from the first and second pre-output control signals while the mode register control signal is enabled.

12. The electronic device of claim 1, further comprising an input/output circuit configured to output internal data, generated through a core circuit, as data when the mode register control signal is disabled, and configured to output an operation code, generated through an operation code generation circuit, as the data when the mode register control signal is enabled.

13. The electronic device of claim 12, wherein the input/output circuit comprises:
a first selection transfer circuit configured to invert and buffer the operation code according to the logic levels of the mode register control signal and the read control signal and configured to output the inverted signal as a selection signal;
a second selection transfer circuit configured to invert and buffer the internal data according to the logic levels of the mode register control signal and the read control signal and configured to output the inverted signal as the selection signal; and
a data output circuit configured to latch the selection signal, invert and buffer the latched selection signal, and output the inverted signal as the data.

14. An electronic device comprising:
a control circuit configured to generate a data output control signal for a read operation based on a column control pulse and an internal column control pulse according to the logic level of a mode register enable signal, configured to generate a read control signal for the read operation and a mode register control signal for a mode register read operation based on any one of the column control pulse and the internal column control pulse, and configured to generate a first input control signal, a second input control signal, a first output control signal, and a second output control signal based on any one of the column control pulse and the internal column control pulse; and an input/output circuit configured to output, as data, any one of internal data that is generated through a core circuit and an operation code generated through an operation code generation circuit, according to the logic levels of the read control signal and the mode register control signal.

15. The electronic device of claim 14, wherein the control circuit comprises:
    a signal synthesis circuit configured to generate a read sum signal by synthesizing the column control pulse and the internal column control pulse;
    a read control circuit configured to generate the data output control signal based on the read sum signal according to the logic level of the mode register enable signal;
    a delay circuit configured to generate a pre-input control signal and the read control signal, each of which includes pulses that are sequentially generated by delaying the read sum signal; and
    a pipe control circuit configured to generate the first and second input control signals that are enabled by the read sum signal, configured to generate the mode register control signal from the mode register enable signal according to the first and second input control signals, and configured to generate the first and second output control signals based on the mode register control signal and the pre-input control signal.

16. The electronic device of claim 15, wherein the signal synthesis circuit comprises:
    a first buffer circuit configured to generate a read input signal by buffering the column control pulse;
    a second buffer circuit configured to generate an internal read input signal by buffering the internal column control pulse; and
    a read sum signal generation circuit configured to generate the read sum signal by synthesizing the read input signal and the internal read input signal.

17. The electronic device of claim 15, wherein the read control circuit comprises:
    a read strobe signal generation circuit configured to generate an inverted read strobe signal by inverting and buffering the read sum signal and configured to generate a read strobe signal by inverting and buffering the inverted read strobe signal;
    a mode register strobe signal generation circuit configured to generate a mode register strobe signal by:
        latching the mode register enable signal according to the logic levels of the inverted read strobe signal and the read strobe signal, and
        inverting and buffering the latched mode register enable signal; and
    a data output control signal generation circuit configured to generate the data output control signal based on the read strobe signal while the mode register strobe signal is disabled.

18. The electronic device of claim 15, wherein the delay circuit comprises:
    a first delay circuit configured to generate a delayed sum signal by delaying the read sum signal;
    a second delay circuit configured to generate the pre-input control signal by delaying the delayed sum signal; and
    a third delay circuit configured to generate the read control signal by delaying the pre-input control signal.

19. The electronic device of claim 15, wherein the pipe control circuit comprises:
    an input control circuit configured to generate the first and second input control signals, which are sequentially counted based on pulses of the read sum signal; and
    an output control circuit configured to generate the mode register control signal by latching the mode register enable signal according to the first and second input control signals and configured to generate the first and second output control signals from the pre-input control signal according to the logic level of the mode register control signal.

20. The electronic device of claim 19, wherein the output control circuit comprises:
    a counter configured to generate a first counting signal and a second counting signal, which are sequentially counted based on pulses of the pre-input control signal;
    a fourth delay circuit configured to generate a first pre-output control signal and a second pre-output control signal by delaying the first and second counting signals;
    a latch circuit configured to latch the mode register enable signal according to pulses of the first and second input control signals and configured to generate the mode register control signal based on the latched mode register enable signal according to pulses of the first and second counting signals; and
    an output control signal generation circuit configured to generate the first and second output control signals from the first and second pre-output control signals while the mode register control signal is enabled.

* * * * *